United States Patent
Tran et al.

(10) Patent No.: US 11,005,454 B1
(45) Date of Patent: May 11, 2021

(54) PRE-DRIVER CIRCUITS FOR AN OUTPUT DRIVER

(71) Applicant: GLOBALFOUNDRIES U.S. Inc., Santa Clara, CA (US)

(72) Inventors: Dzung T. Tran, Austin, TX (US); Sushama Davar, Leander, TX (US)

(73) Assignee: GLOBALFOUNDRIES U.S. Inc., Santa Clara, CA (US)

( * ) Notice: Subject to any disclaimer, the term of this patent is extended or adjusted under 35 U.S.C. 154(b) by 0 days.

(21) Appl. No.: 16/793,010

(22) Filed: Feb. 18, 2020

Related U.S. Application Data

(63) Continuation-in-part of application No. 16/720,181, filed on Dec. 19, 2019, now Pat. No. 10,735,000.

(51) Int. Cl.
| | |
|---|---|
| *H03K 3/013* | (2006.01) |
| *H03K 3/3568* | (2006.01) |
| *H03K 19/017* | (2006.01) |
| *H03K 19/003* | (2006.01) |

(52) U.S. Cl.
CPC ........ *H03K 3/013* (2013.01); *H03K 3/3568* (2013.01); *H03K 19/00323* (2013.01); *H03K 19/00384* (2013.01); *H03K 19/01721* (2013.01)

(58) Field of Classification Search
None
See application file for complete search history.

(56) References Cited

U.S. PATENT DOCUMENTS

| | | | |
|---|---|---|---|
| 4,789,796 A | 12/1988 | Foss | |
| 5,039,893 A | 8/1991 | Tomisawa | |
| 5,122,690 A | 6/1992 | Bianchi | |
| 5,537,070 A | 7/1996 | Risinger | |
| 6,225,844 B1 * | 5/2001 | Fujiwara | H03K 19/00361 327/108 |
| 6,720,805 B1 | 4/2004 | Haas | |
| 6,924,669 B2 | 8/2005 | Itoh et al. | |
| 7,245,156 B2 | 7/2007 | Yeung et al. | |
| 7,737,728 B1 | 6/2010 | Truong et al. | |
| 8,816,727 B2 | 8/2014 | Hoogendoorn | |
| 9,344,088 B1 * | 5/2016 | Sanchez | H03K 19/00384 |
| 9,438,236 B2 | 9/2016 | Priel et al. | |

(Continued)

*Primary Examiner* — Jany Richardson
(74) *Attorney, Agent, or Firm* — Gibb & Riley, LLC; David A. Cain, Esq.

(57) ABSTRACT

A disclosed pre-driver circuit includes multiple signal generation stages configured to receive different bias voltages from local switching bias circuit(s). In some embodiment, pre-driver circuit has multiple switching bias circuits, each with a bias voltage node connected to a corresponding stage. In other embodiments, the pre-driver circuit has a single switching bias circuit with multiple bias voltage nodes and a multi-input/multi-output multiplexor with inputs connected to the bias voltage nodes and outputs connected to the stages. The switching bias circuit(s) and a primary inverter in each stage all receive the same input signal. When this input signal transitions, the switching bias circuit(s) supply bias voltages to the stages and the primary inverters turn on in sequence and slowly, thereby ensuring that pre-driver signals generated by the different stages transition in sequence and at a relatively slow rate. Once the last pre-driver signal transitions, the switching bias circuit(s) turn off.

20 Claims, 14 Drawing Sheets

(56) References Cited

U.S. PATENT DOCUMENTS

| | | | |
|---|---|---|---|
| 2010/0253391 A1* | 10/2010 | Truong | H03K 5/133 327/108 |
| 2013/0257490 A1* | 10/2013 | Kanayama | H03K 19/018571 327/109 |
| 2017/0214403 A1* | 7/2017 | Arai | H03K 19/0016 |

* cited by examiner

PRE-DRIVER CIRCUITS FOR AN OUTPUT DRIVER

CROSS REFERENCE TO RELATED APPLICATIONS

This application is a continuation-in-part (CIP) of presently U.S. application Ser. No. 16/720,181, filed on Dec. 19, 2019, now issued as U.S. Pat. No. 10,735,000 on Aug. 4, 2020, the complete disclosure of which is incorporated herein by reference.

BACKGROUND

Field of the Invention

The present invention relates to output drivers and, more particularly, to pre-driver circuits that can be incorporated into an output driver.

Description of Related Art

Generally, an output driver receives a data out signal and, based on the data out signal, produces an amplified data out signal on an output pad. Specifically, the output driver includes a pull-up path and a pull-down path and these two paths are selectively and alternatively turned on to either pull-up the voltage level on the output pad or pull-down the voltage level on the output pad, respectively, in response to switching of the data output signal. The pull-up and the pull-down paths each include a level shifter that increases the data signal level (e.g., from 0.8V to 1.8V) to produce an up-shifted signal. The pull-up and the pull-down paths each further include a pre-driver circuit (also referred to herein as a pre-driver). For the pull-up path, the pre-driver can receive the up-shifted signal and, using the up-shifted signal, can produce and output multiple different pull-up pre-driver signals (e.g., three pull-up pre-driver signals including one inverted signal and two different delayed inverted signals). For the pull-down path, the pre-driver can similarly receive the up-shifted signal and, using the up-shifted signal, can produce and output multiple different pull-down pre-driver signals (e.g., three pull-down pre-driver signals including one inverted signal and two different delayed inverted signals). The pull-up and the pull-down paths can each further include a main driver with multiple (e.g., three) driver stages. For the pull-up path, the stages of the main driver can receive the different pull-up pre-driver signals, respectively, turning on sequentially due to the delay in order to reduce switching noise and add adjustable output slew-rate to the amplified data out signal at the output pad. Similarly, for the pull-down path, the stages of the main driver can receive the different pull-down pre-driver signals, respectively, turning on sequentially due to the delay in order to reduce switching noise and add adjustable output slew-rate to the amplified data output signal at the output pad.

Historically, in each pre-driver circuit, the multiple different pre-driver signals (e.g., including an inverted signal and two different delayed inverted signals) are generated using field effect transistors (FETs) with different gate lengths and thereby different channel lengths to add the different delays. That is, the different pre-driver signals are generated through the use of FETs having different channel lengths, where the FETs with the longer channel lengths are used to achieve longer delays. Unfortunately, in advanced technology nodes (e.g., at the 12 nm fin-type field effect transistor (FinFET) technology node and beyond) there are process limitations that make increasing channel lengths difficult. To avoid using FETs having different channel lengths in the pre-drivers, designers at these advanced technology nodes currently use inverter chains with taps along with remote voltage generators for the power supply that controls the inverter chain. However, this solution is costly in terms of both area consumption and power consumption. Furthermore, the amount of delay provided by the inverter chain is typically not tunable (e.g., to account for process variation).

SUMMARY

In view of the foregoing, disclosed in the parent application were embodiments of a pre-driver circuit (e.g., either a pull-up pre-driver or a pull-down pre-driver) for an output driver. The pre-driver circuit includes multiple signal generation stages for generating and outputting multiple different pre-driver signals, respectively, and a local switching bias circuit for providing a bias voltage to the stages when needed. The local switching bias circuit can have a pair of on/off switches (i.e., a first switch and a second switch). The first switch of the local switching bias circuit and primary inverters in each of the stages can all receive the same input signal. When the input signal transitions from a first voltage level to a second voltage level, the first switch turns on the local switching bias circuit in order to supply the same bias voltage to each of the stages. However, the primary inverters do not concurrently invert the input signal. Instead, due to the bias voltage and further due to some additional circuitry within each stage (discussed in greater detail in the detailed description section below), the primary inverters in the different stages turn on in sequence, thereby ensuring that different pre-driver signals generated and output by the different stages, respectively, transition from the second voltage level to the first voltage level in sequence and at a slower rate than the transition of the input signal. Once the last pre-driver signal transitions to the first voltage level, the second switch turns off the local switching bias circuit. Optionally, the local switching bias circuit can include multiple bias voltage nodes and a multiplexor that selectively applies the bias voltage from only one of these nodes to each of the stages in order to tune the delay and transition times (i.e., slew rates) of the delay signals.

Disclosed in this continuation-in-part application are pre-driver circuit embodiments for an output driver and these embodiments are similar to the pre-driver circuit embodiments disclosed in the parent application or, more particularly, are alternative configurations for those embodiments. In the pre-driver circuit embodiments disclosed herein instead of the signal generation stages all receiving the same specific bias voltage from a single local switching bias circuit, they can receive different specific bias voltages from different local switching bias circuits or from the same local switching bias circuit via a multi-input/multi-output multiplexor. By allowing different specific bias voltages to be supplied to the different signal generation stages, the delays and transition times (i.e., slew rates) of the pre-driver signals can be individually varied (i.e., finely tuned, adjusted, etc.) to further reduce noise.

More specifically, all pre-driver circuit embodiments disclosed herein can include multiple signal generation stages (i.e., two or more signal generation stages) for generating and outputting pre-driver signals, respectively. For example, all of the pre-driver circuit embodiments disclosed herein can include: a first stage for generating and outputting a first pre-driver signal; a second stage for generating and outputting a second pre-driver signal; and a last stage for generating and outputting a last pre-driver signal.

In some of the pre-driver circuit embodiments disclosed herein, the pre-driver circuit can also include multiple local switching bias circuits. Each local switching bias circuit can include a bias voltage node that is electrically connected to a corresponding signal generation stage. Each local switching bias circuit can be configured to generate a specific bias voltage on that bias voltage node when in an ON-state and the specific bias voltages on the bias voltage nodes of the different local switching bias circuits can be different. Each local switching bias circuit can further include on/off switches (i.e., a first switch and a second switch). The first switches of all of the local switching bias circuits can be controlled as discussed in greater detail below by an input signal to the pre-driver circuit so that the local switching bias circuits turn on concurrently and only when needed. The second switches of all of the local switching bias circuits can be controlled as discussed in greater detail below by the last pre-driver signal generated and output by the last stage so that the local switching bias circuits are all turned off concurrently when no longer needed.

With this configuration, during normal operation, all first switches of all local switching bias circuits and each of the signal generation stages can receive an input signal for processing. In response to the input signal transitioning from a first voltage level to a second voltage level, the first switches can concurrently turn on the local switching bias circuits, thereby supplying the specific bias voltages from the local switching bias circuits to the signal generation stages, respectively. Also in response to the input signal transitioning from the first voltage level to the second voltage level and given the received specific bias voltages, the signal generation stages can generate and output the pre-driver signals (e.g., the first stage can generate and output the first pre-driver signal, the second stage can generate and output the second pre-driver signal, and the last stage can generate and output the last pre-driver signal).

Due to the specific bias voltages received by the signal generation stages from the local switching bias circuits and further due to specific circuitry within each stage (discussed in greater detail below), the signal generation stages can generate and output these pre-driver signals such that the pre-driver signals are inverted with respect to the input signal, such that transitioning of the pre-driver signals from the second voltage level to the first voltage level occurs in sequence (i.e., with a first pre-driver signal from the first stage transitioning first and a last signal from the last stage transitioning last), and such that this transitioning occurs at a slower rate than transitioning of the input signal. Additionally, by supplying different specific bias voltages to the different signal generation stages, the delays and transition times (i.e., slew rates) of the pre-driver signals are individually varied (i.e., finely tuned, adjusted, etc.) to reduce noise.

Finally, the second switches in all of the local switching bias circuits can receive the last pre-driver signal output from the last stage in a feedback loop and, in response to the last pre-driver signal transitioning from the second voltage level back to the first voltage level, the second switches can concurrently turn off the local switching bias circuits.

In other pre-driver circuit embodiments disclosed herein, the pre-driver circuit can include a single local switching bias circuit with multiple bias voltage nodes. The single local switching bias circuit can be configured to generate different specific bias voltages on the bias voltage nodes when in an ON-state. The local switching bias circuit can further include on/off switches (i.e., a first switch and a second switch). The first switch can be controlled as discussed in greater detail below by an input signal to the pre-driver circuit so that the local switching bias circuit is turned on only when needed. The second switch can be controlled as discussed in greater detail below by the last pre-driver signal output from the last stage so that the local switching bias circuit is turned off when no longer needed. The pre-driver circuit can further include a multi-input/multi-output multiplexor. This multiplexor can have inputs electrically connected to the bias voltage nodes, respectively, of the local switching bias circuit. This multiplexor can further have discrete outputs electrically connected to the signal generation stages, respectively.

With this configuration, during normal operation, the first switch of the local switching bias circuit and each of the stages can receive an input signal. In response to the input signal transitioning from a first voltage level to a second voltage level, the first switch can turn on the local switching bias circuit in order to generate the different specific bias voltages on the bias voltage nodes. The multiplexor can receive the stage-specific bias voltage select signals (i.e., bias voltage select signals for each of the signal generation stages) and, in response to these signals, can electrically connect the signal generation stages to selected bias voltage nodes, respectively. That is, each signal generation stage can be selectively connected to any one of the bias voltage nodes and, as a result, selected specific bias voltages can be supplied to the signal generation stages. Also, in response to the input signal transitioning from the first voltage level to the second voltage level and given the received specific bias voltages, the signal generation stages can generate and output the pre-driver signals (e.g., the first stage can generate and output the first pre-driver signal, the second stage can generate and output the second pre-driver signal, and the last stage can generate and output the last pre-driver signal).

Due to the selected specific bias voltages received by the signal generation stages from the local switching bias circuit and further due to specific circuitry within each stage (discussed in greater detail below), the signal generation stages can generate and output the pre-driver signals such that the pre-driver signals are inverted with respect to the input signal, such that transitioning of the pre-driver signals from the second voltage level to the first voltage level occurs in sequence (i.e., with a first pre-driver signal from the first stage transitioning first and a last signal from the last stage transitioning last), and further such that this transitioning occurs at a slower rate than transitioning of the input signal. Additionally, by supplying different selected specific bias voltages to the different signal generation stages, the delays and transition times (i.e., slew rates) of the pre-driver signals are individually varied (i.e., finely tuned, adjusted, etc.) to reduce noise.

Finally, the second switch in the local switching bias circuit can receive the last pre-driver signal output from the last stage in a feedback loop and, in response to the last pre-driver signal transitioning from the second voltage level back to the first voltage level, the second switch can turn off the local switching bias circuit.

BRIEF DESCRIPTION OF THE SEVERAL VIEWS OF THE DRAWINGS

The present invention will be better understood from the following detailed description with reference to the drawings, which are not necessarily drawn to scale and in which.

DETAILED DESCRIPTION

Figure 1A:
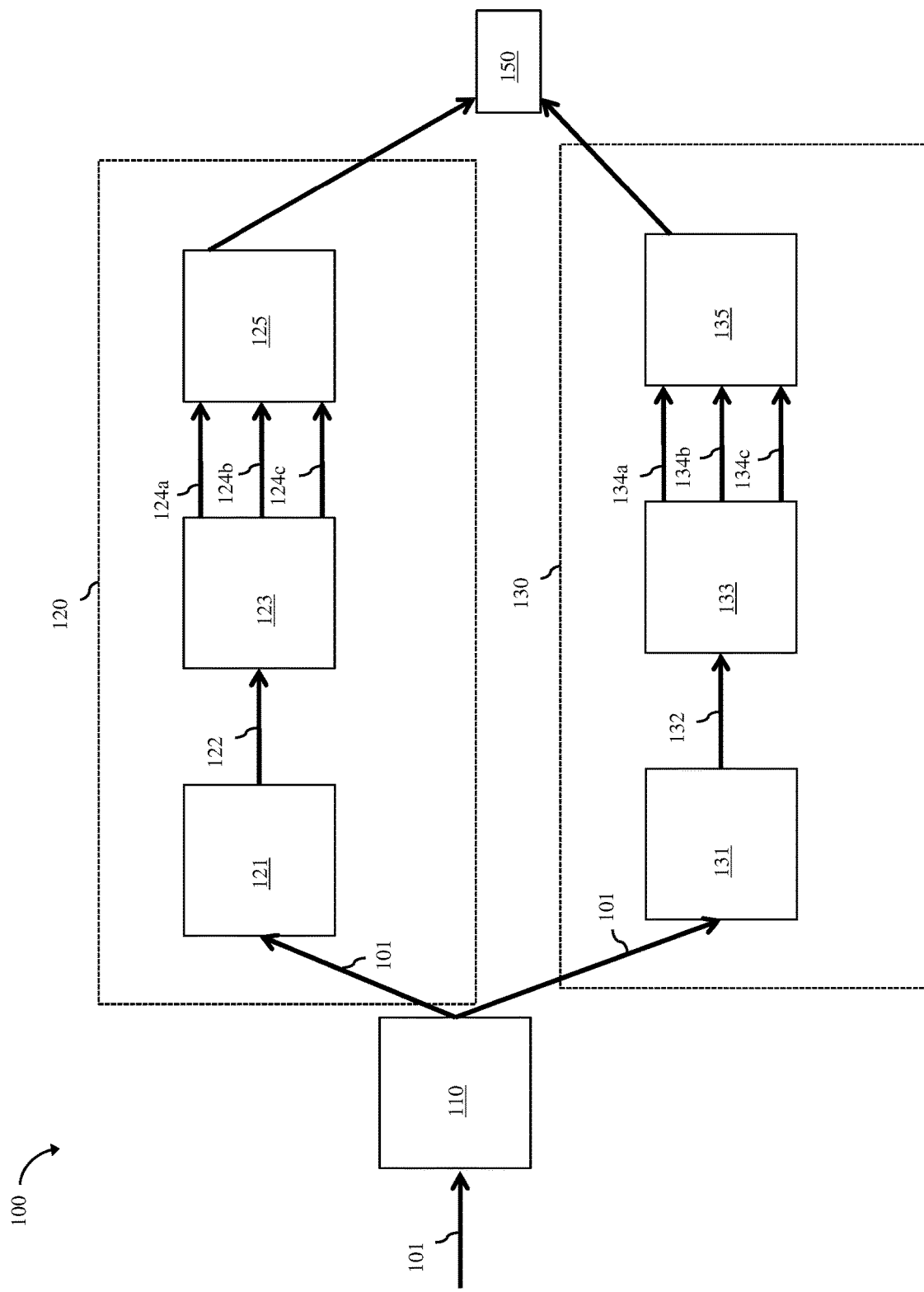
FIG. 1A is a schematic diagram an output driver and the components thereof.

As mentioned above, an output driver receives a data out signal and, based on the data out signal, produces an amplified data out signal on an output pad. FIG. 1A is a schematic drawing of an exemplary output driver 100. In this output driver 100, a received data out signal 101 is selectively passed by control logic 110 to either a pull-up path 120, which is configured to pull-up the voltage level on the output pad 150, or a pull-down path 130, which is configured to pull-down the voltage level on the output pad 150. The pull-up path 120 and the pull-down path 130 each include a level shifter 121, 131 that up-shifts the voltage level on the data output signal 101 (e.g., from 0.8V to 1.8V) in order to produce an up-shifted signal 122, 132. The pull-up path 120 and the pull-down path 130 each further include a pre-driver circuit 123, 133. For the pull-up path, the pre-driver circuit 123 can receive the up-shifted signal 122 and, using the up-shifted signal 122, can produce and output multiple different pull-up pre-driver signals (e.g., three different pull-up pre-driver signals including an inverted signal 124a and two different delayed inverted signals 124b and 124c). For the pull-down path, the pre-driver circuit 133 can receive the up-shifted signal 132 and, using the up-shifted signal 132, can produce and output multiple different pull-down pre-driver signals (e.g., three different pull-down pre-driver signals include an inverted signal 134a and two different delayed inverted signals 134b and 134c). The pull-up and the pull-down paths 120, 130 can each further include a main driver 125 with multiple driver stages. For the pull-up path 120, the stages of the main driver 125 can receive the pull-up pre-driver signals 124a-124c, respectively, turning on sequentially due to the delay in order to reduce switching noise and add adjustable output slew-rate of the amplified data out signal at the output pad 150. Similarly, for the pull-down path 130, the stages of the main driver 135 can receive the pull-down pre-driver signals 134a-134c, respectively, turning on sequentially due to the delay in order to reduce switching noise and add adjustable output slew-rate of the amplified data out signal at the output pad 150.

Figure 1B:
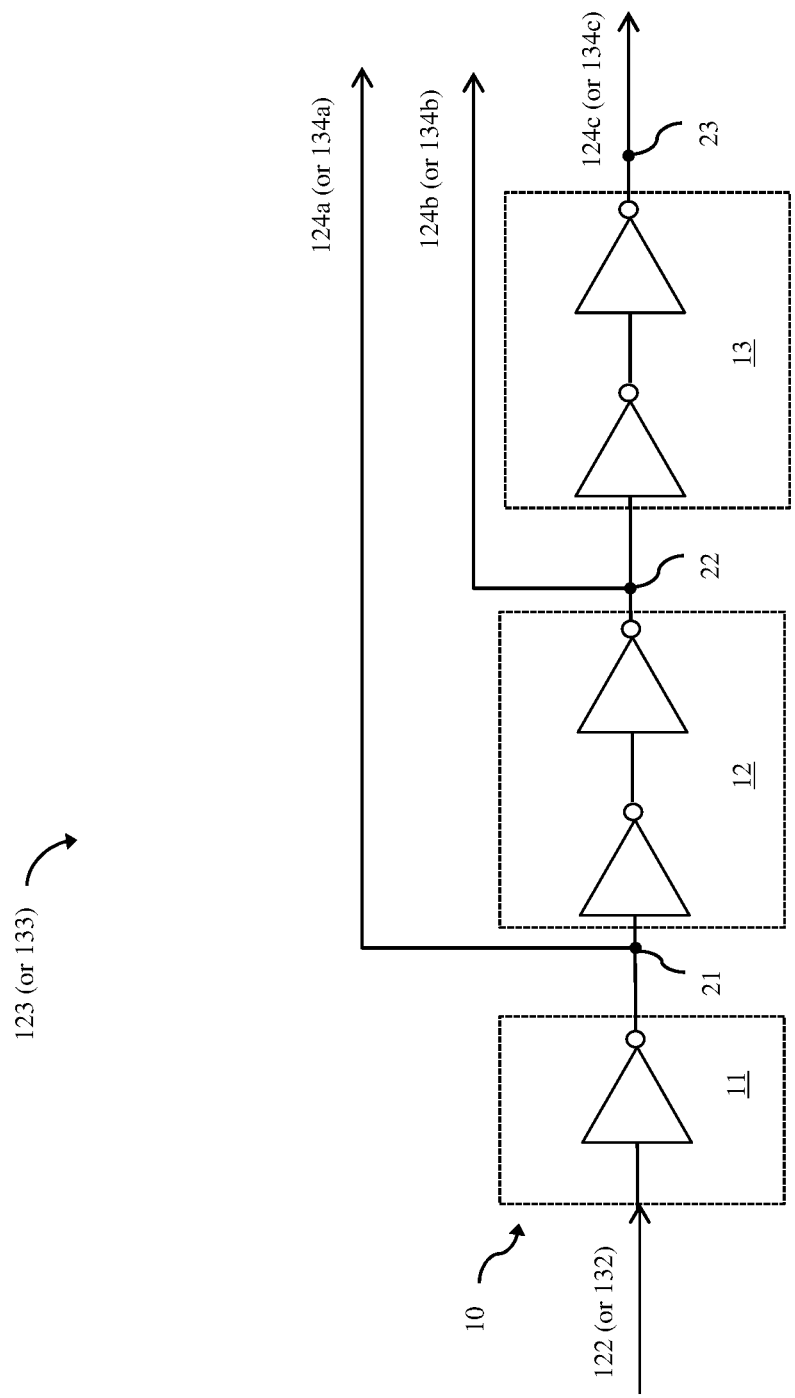
FIG. 1B is a schematic diagram illustrating a conventional pre-driver that can be incorporated into the pull-up and pull-down paths of the output driver of FIG. 1A.

Historically, in each pre-driver circuit, the multiple different pre-driver signals (e.g., including an inverted signal and two different delayed inverted signals) are generated using field effect transistors (FETs) with different gate lengths and thereby different channel lengths to add the different delays. That is, the different pre-driver signals are generated through the use of FETs having different channel lengths, where the FETs with the longer channel lengths are used to achieve longer delays. Unfortunately, in advanced technology nodes (e.g., at the 12 nm fin-type field effect transistor (FinFET) technology node and beyond) there are process limitations that make increasing channel lengths difficult. To avoid using FETs having different channel lengths in the pre-drivers 123, 133, designers at these advanced technology nodes currently use an inverter chain 10 with taps 21-23 after stages 11-13, respectively (e.g., as shown in FIG. 1B), and further use remote voltage generators (not shown) for the power supply that controls the inverter chain 10. However, this solution is costly in terms of both area consumption and power consumption. Furthermore, the amount of delay provided by the inverter chain is typically not tunable (e.g., to account for process variation).

In view of the foregoing, disclosed in the parent application were embodiments of a pre-driver circuit (also referred to as a pre-driver, e.g., either a pull-up pre-driver or a pull-down pre-driver) for an output driver. The pre-driver circuit includes multiple signal generation stages for generating and outputting multiple different pre-driver signals, respectively, and a local switching bias circuit for providing a bias voltage to the stages when needed. The local switching bias circuit can have a pair of on/off switches (i.e., a first switch and a second switch). The first switch of the local switching bias circuit and primary inverters in each of the stages can all receive the same input signal. When the input signal transitions from a first voltage level to a second voltage level, the first switch turns on the local switching bias circuit in order to supply the same bias voltage to each of the stages. However, the primary inverters do not concurrently invert the input signal. Instead, due to the bias voltage and further due to some additional circuitry within each stage (discussed in greater detail in the detailed description section below), the primary inverters in the different stages turn on in sequence, thereby ensuring that different pre-driver signals generated and output by the different stages, respectively, transition from the second voltage level to the first voltage level in sequence and at a slower rate than the transition of the input signal. Once the last pre-driver signal transitions to the first voltage level, the second switch turns off the local switching bias circuit. Optionally, the local switching bias circuit can include multiple bias voltage nodes and a multiplexor that selectively applies the bias voltage from only one of these nodes to each of the stages in order to tune the delay and transition times (i.e., slew rates) of the delay signals.

Figure 2:
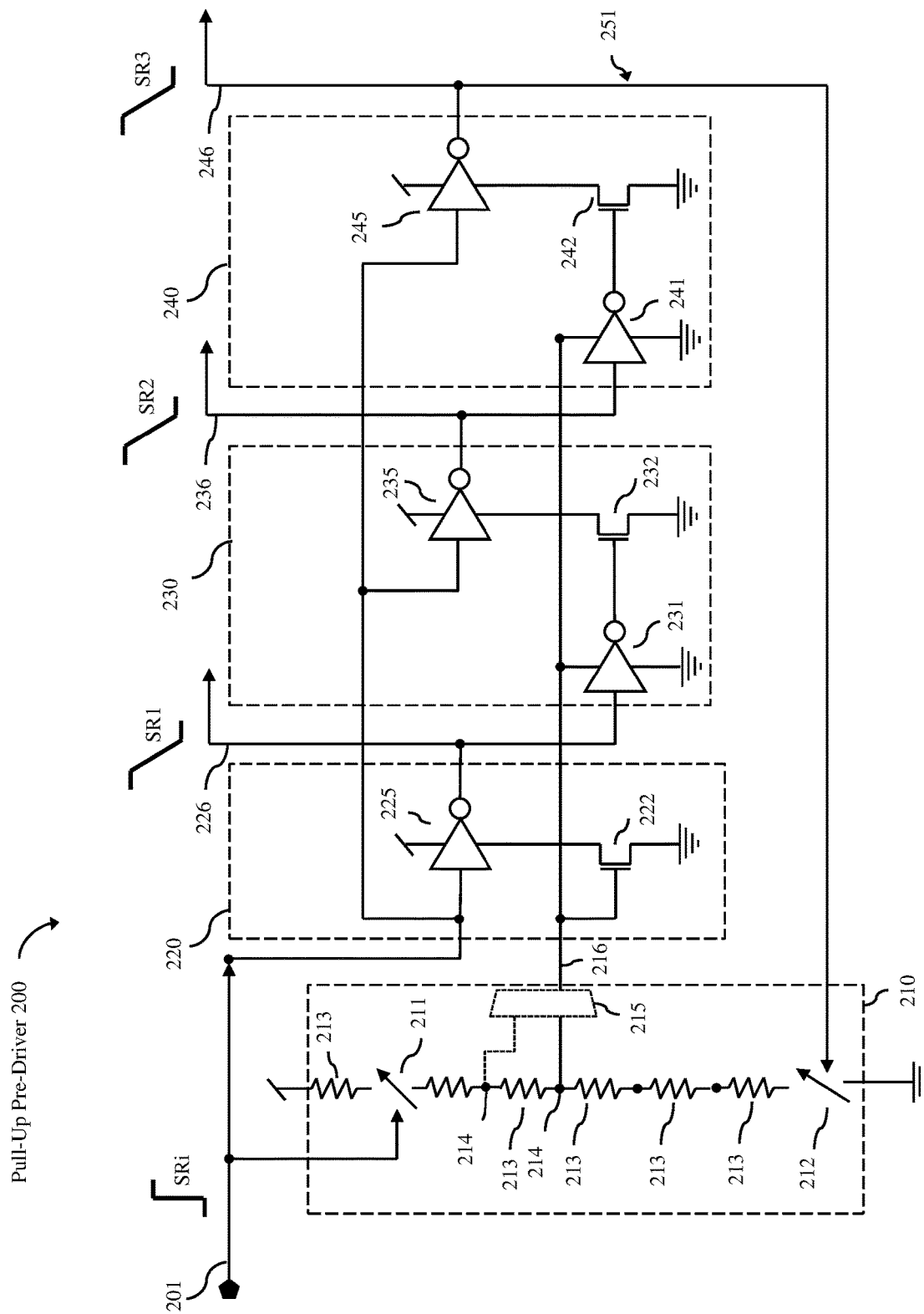
FIG. 2 is a schematic diagram illustrating an embodiment of a pull-up pre-driver.
Figure 3:
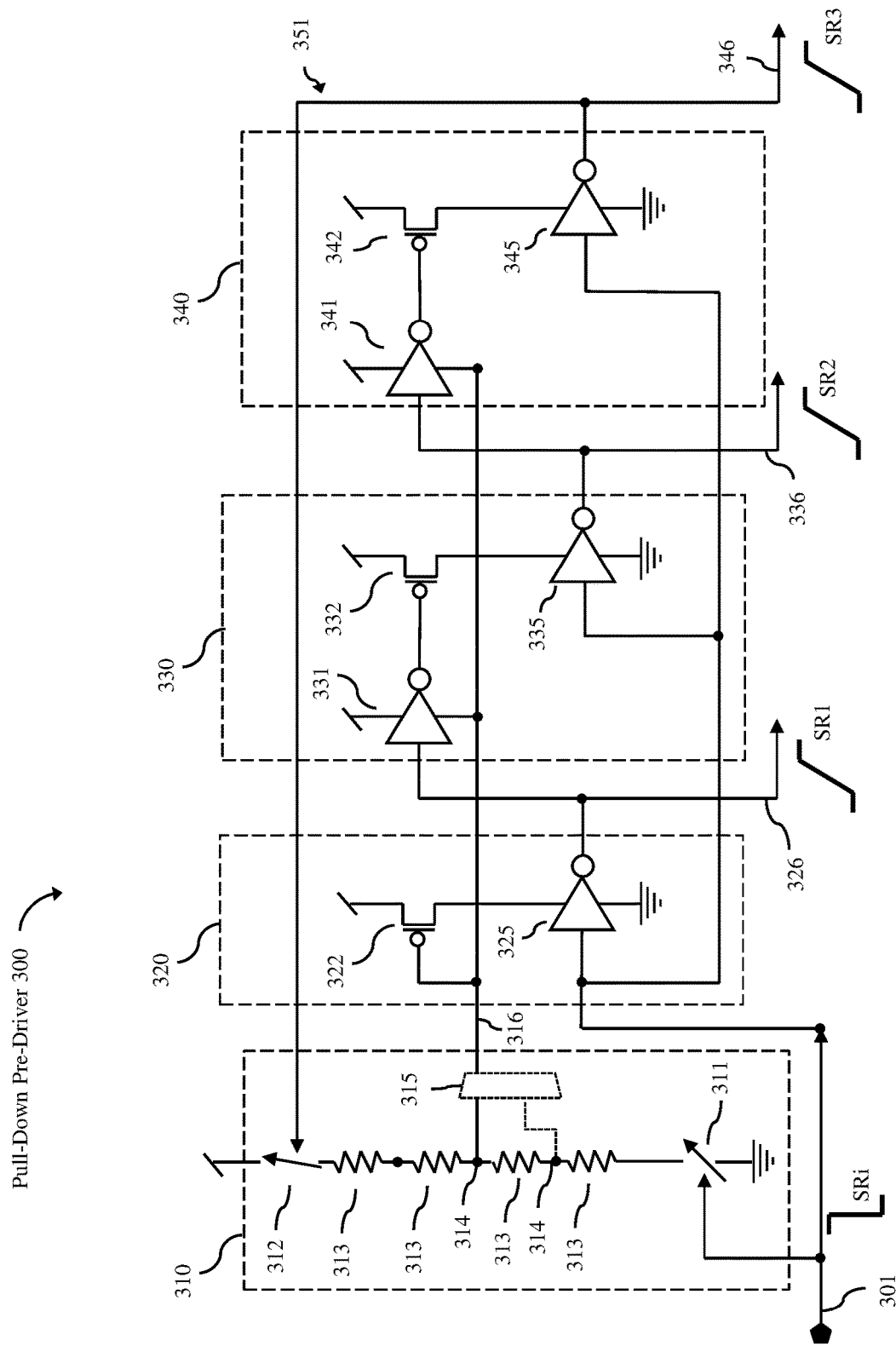
FIG. 3 is a schematic diagram illustrating an embodiment a pull-down pre-driver.

Generally, disclosed in the parent application were various embodiments of pre-driver circuits (also referred to herein as pre-drivers) for an output driver including a pull-up pre-driver 200, as shown in FIG. 2, and a pull-down pre-driver 300, as shown in FIG. 3. The pre-drivers 200/300 can each include: multiple signal generation stages 220/320, 230/330, 240/340 for generating and outputting different pre-driver signals 226/326, 236/336, 246/346, respectively, in response to an input signal 201/301. Each of the pre-drivers 200/300 can also include a local switching bias circuit 210/310 for providing a bias voltage 216/316 to each of the stages during generation of the pre-driver signals 226/326, 236/336, 246/346.

The switching bias circuit 210/310 can include a group of series-connected resistors 213/313. At one end, the series-connected resistors can be connected by a first switch 211/311 to a first voltage rail. At the opposite end, the series-connected resistors can be connected by a second switch 212/312 to a second voltage rail. As discussed in greater detail below, the first switch 211/311 can be controlled by the input signal 201/301 to the delay pre-driver 200/300 and the second switch 212/312 can be controlled by the last pre-driver signal 246/346 output by the last stage in a feedback loop 251/351 so that the switching bias circuit 210/310 is only turned on when needed. The switching bias circuit 210/310 can further include a bias voltage node 214/314 at a junction between adjacent resistors in the group. When turned on, the switching bias circuit 210/310 can generate (i.e., can be adapted to generate, can be configured to generate, etc.) a bias voltage 216/316 at some desired level at the bias voltage node 214/314. As discussed in greater detail below, level of the bias voltage 214/314 will vary depending upon whether the pre-driver is a pull-up pre-driver 200 as in FIG. 2 or a pull-down pre-driver 300 as in FIG. 3.

The multiple signal generation stages can include: a first stage 220/320 (also referred to herein as an inverter only stage); a second stage 230/330 (also referred to herein as a delay/inverter stage); and a last stage 240/340 (also referred to herein as an additional delay/inverter stage). Each stage can receive the same input signal 201, 301 and can generate and output a corresponding pre-driver signal. The first pre-driver signal 226/326, the second pre-driver signal 236/336, and last pre-driver signal 246/346 can all be inverted with respect to the input signal 201/301. Additionally, the second pre-driver signal 236/336 and the last pre-driver signal 246/346 can be delayed by different amounts. Thus, the first pre-driver signal 226/326, the second pre-driver signal 236/336 and the last pre-driver signal 246/346 transition in sequence. Furthermore, this transition occurs at a slower rate than the transition of the input signal 201/301. That is, the slew rate of the pre-driver signals is longer than the slew rate of the input signal 201/301.

To accomplish this, the stages 220/320, 230/330, 240/340 can each include a primary inverter 225/325, 235/335, 245/345, which is configured to receive and invert the same input signal 201/301. Each stage 220/320, 230/330, 240/340 can also include a power supply transistor 222/322, 232/332, 242/342 (e.g., an n-type field effect transistor (NFET) in the case of the pull-up pre-driver 200 and a p-type field effect transistor (PFET) in the case of the pull-down pre-driver 300), which is electrically connected to the primary inverter 225/325, 235/335, 245/345 and which is configured to supply power to the primary inverter 225/325, 235/335, 245/345 when a bias voltage 216/316 is applied to its gate. The connection between the power supply transistor 222/322, 232/332, 242/342 and the primary inverter 225/325, 235/335,245/345 is such that, when the power supply transistor 222/322, 232/332, 242/342 is turned on, the primary inverter 225/325, 235/335, 245/345 can output a pre-driver signal 226/326, 236/336, 246/346 that is inverted with respect to the input signal 201/301.

The bias voltage node 214/314 can be electrically coupled to (i.e., electrically connected to) each of the stages 220/320, 230/330, 240/340.

Specifically, in the first stage 220/320, the gate of the power supply transistor 222/322 is electrically connected to the bias voltage node 214/314 directly (or via a multiplexor 215/315, as discussed below) so that the power supply transistor 222/322 will turn on when the switching bias circuit 210/310 is turned on.

The second and last stages 230/330 and 240/340 can also each include a delay inverter 231/331, 241/341. The delay inverter 231/331, 241/341 in these stages can be electrically connected between the bias voltage node 214/314 and a voltage rail (e.g., ground in the case of the pull-up pre-driver 200 and a VDD rail in the case of the pull-down pre-driver 300). The inputs to the delay inverters 231/331, 241/341 can be the pre-driver signals from the primary inverters of the previous stages. That is, the input to the delay inverter 231/331 of the second stage 230/330 can be the first pre-driver signal 226/326 from the primary inverter 225/325 of the first stage 220/320 and the input to the delay inverter 241/341 of the third stage 240/340 can be the second pre-driver signal 236/336 from the primary inverter 235/335 of the second stage 230/330. Furthermore, the outputs of the delay inverters 231/331, 241/341 in the second and last stages 230/330, 240/340 can be applied to the gates of the power supply transistors 232/332, 242/342 in those stages, respectively. Thus, turning on of the power supply transistors 232/332, 242/342 in the second and last stages will occur when the outputs of the delay inverters 231/331, 241/341 switch to the bias voltage 216/316 level (as discussed in greater detail below).

Each of the pre-drivers 200/300 can operate as follows. The first switch 211/311 of the switching bias circuit 210/310 and the primary inverter 222/322, 232/332, 242/342 in each of the stages 220/320, 230/330, 240/340 can all receive the input signal 201/301. In response to this input signal 201/301 transitioning from a first voltage level to a second voltage level, the first switch 211/311 can turn on the switching bias circuit 210/310 so as to supply the bias voltage 216/316 to each of the stages 220/320, 230/330, 240/340.

In the first stage 220/320, the bias voltage 216/316 turns on the power supply transistor 222/322, thereby turning on the primary inverter 225/325. The primary inverter 225/325 can then generate and output the first pre-driver signal 226/326, which is inverted with respect to the input signal 201/301 (i.e., which transitions from the second voltage level to the first voltage level).

In the second stage 230/330, the bias voltage 216/316 enables operation of the delay inverter 231/331; however, the power supply transistor 232/332 does not turn on until the first pre-driver signal 226/326 from the primary inverter 235/325 of the first stage 220/320 has transitioned from the second voltage level to the first voltage level so that the output of the delay inverter 231/331, which is applied to the gate of the power supply transistor 232/332, has transitioned to the bias voltage level. Once the power supply transistor 232/332 in the second stage 230/330 is turned on, the primary inverter 235/335 of the second stage 230/330 can generate and output a second pre-driver signal 236/336 that is inverted and delayed with respect to the input signal 201/301.

In the last stage 240/340, the bias voltage 216/316 enables operation of the delay inverter 241/341; however, the power supply transistor 242/342 does not turn on until the second pre-driver signal 226/336 from the primary inverter 235/335 of the second stage 230/330 has transitioned from the second voltage level to the first voltage level so that the output from the delay inverter 241/341, which is applied to the gate of the power supply transistor 242/342, has transitioned to the bias voltage level. Once the power supply transistor 242/342 in the last stage 340 is turned on, the primary inverter 245/345 of the last stage 240/340 can generate and output a last pre-driver signal 246/346 that is inverted and further delayed with respect to the input signal 201/301. As mentioned above, the last pre-driver signal 246/346 output from the last stage 240/340 controls the second switch 212/312 and, when this last pre-driver signal 246/346 transitions from the second voltage level back to the first voltage level, the second switch 212/312 turns off the switching bias circuit 210/310. By turning off the switching bias circuit 310 once the pre-driver signals 226/326, 236/336, 246/346 are all generated, leakage current is reduced.

Thus, due to the power supply transistor 222/322 in the first stage 220/320 being turned on by the bias voltage 216/316 and further due to the configuration in the downstream stages where the delay inverters 231/331, 241/341 are powered by the bias voltage and have outputs that are dependent on the pre-driver signals 226/326, 236/336 from the previous stages and that control the on/off states of the power supply transistors 232/332, 242/342, the power supply transistors 222/322, 232/332, 242/342 in the stages 220/320, 230/330, 240/340, respectively, turn on in sequence and also act as weak resistors. Thus, the pre-driver signals 226/326, 236/336, 246/346 output from these stages 220/320, 230/330, 240/340, respectively, transition from the second voltage level to the first voltage level in sequence and also at a slower rate than the rate at which the input signal 201/301 transitions from the first voltage level to the second voltage level. By causing the transitions to occur in sequence and at a relatively slow rate, noise is reduced.

It should be noted that, depending upon whether the pre-driver is a pull-up pre-driver for the pull-up path of an output driver or a pull-down pre-driver of the pull-down path of the output driver, specific features of the circuit will vary.

For example, as mentioned above, in the pull-up pre-driver 200 of FIG. 2, the power supply transistors 222, 232, 242 can be NFETs. In this case, during a normal operating mode, the first switch 211 of the switching bias circuit 210 and the primary inverter 225, 235, 245 in each of the stages 220, 230, 240 can receive the input signal 201. In response to this input signal 201 transitioning from a low voltage level to a high voltage level, the first switch 211 (e.g., an NFET or some other suitable type of switch) can turn on the switching bias circuit 210 in order to supply a bias voltage 216, which is at some specific bias voltage level within a range from approximately one-half of VDD to VDD, to each of the stages 220, 230, 240. In the first stage 220, this bias voltage 216 can be applied to the gate of the NFET power supply transistor 222, thereby turning on the NFET power supply transistor 222 and enabling operation of the primary inverter 225. The primary inverter 225 can generate and output a first pull-up pre-driver signal 226, which is inverted with respect to the input signal 201 (i.e., which transitions from the high voltage level to the low voltage level). Since the bias voltage 216 is less than VDD, but above one-half VDD, the NFET power supply transistor 222 will turn on but at a relatively slow switching speed. In the second stage 230, the NFET power supply transistor 232 does not turn on until the first pull-up pre-driver signal 226 from the primary inverter 225 of the first stage 220 has transitioned from the high voltage level to the low voltage level and the output from the delay inverter 231, which is applied to the gate of the NFET power supply transistor 232, has transitioned to the bias voltage level. Once the NFET power supply transistor 232 in the second stage 230 is turned on, the primary inverter 235 of the second stage 230 can generate and output a second pull-up pre-driver signal 236 that is inverted and delayed with respect to the input signal 201. In the last stage 240, the NFET power supply transistor 242 does not turn on until the second pull-up pre-driver signal 236 from the primary inverter 235 of the second stage 230 has transitioned from the high voltage level to the low voltage level and the output from the delay inverter 241, which is applied to the gate of the NFET power supply transistor 242, has transitioned to the bias voltage level. Once the NFET power supply transistor 242 in the last stage 240 is turned on, the primary inverter 245 of the last stage 240 can generate and output the last pull-up pre-driver signal 246 that is inverted and further delayed with respect to the input signal 201. The last pull-up pre-driver signal 246, which is output from the last stage 240, can be applied to the second switch 212 in a feedback loop 251. Thus, the last pull-up pre-driver signal 246 can control the second switch 212 (e.g., another NFET or some other suitable type of switch) and thereby the on/off state of the switching bias circuit 210. Thus, when this last pull-up pre-driver signal 246 transitions from the high voltage level back to the low voltage level, the second switch 212 can turn off the switching bias circuit 210. It should be noted that in such a pull-up pre-driver, switch point of the delay inverters in the second and third stages is lowered down so that it is between the bias voltage and VSS because VDD is not used as a power supply. This helps increase the delay of the delay inverters. Otherwise, multiple inverting stages will be needed to create delay.

Also, as mentioned above, in the pull-down pre-driver 300 of FIG. 3, the power supply transistors 322, 332, 342 can be PFETs. In this case, during a normal operating mode, the first switch 311 of the switching bias circuit 310 and the primary inverter 325, 335, 345 in each of the stages 320, 330, 340 can all receive the input signal 301. In response to this input signal 301 transitioning from a high voltage level to a low voltage level, the first switch 311 (e.g., a PFET or some other suitable type of switch) can turn on the switching bias circuit 310 and supply a bias voltage 316, which is at some specific bias voltage level within a range from VSS to approximately one-half VDD, to each of the stages 320, 330, 340. In the first stage 320, this bias voltage 316 can be applied to the gate of the PFET power supply transistor 322, thereby turning on the PFET power supply transistor 322 and enabling operation of the primary inverter 325. The primary inverter 325 can then generate and output the first pull-down pre-driver signal 326, which is inverted with respect to the input signal 301 (i.e., which transitions from the low voltage level to the high voltage level). Since the bias voltage 316 is greater than ground but less than one-half VDD, the PFET will turn on but at a relatively slow switching speed. In the second stage 330, the PFET power supply transistor 332 does not turn on until the first pull-down pre-driver signal 326 from the primary inverter 325 of the first stage 320 has transitioned from the low voltage level to the high voltage level and the output from the delay inverter 331, which is applied to the gate of the PFET power supply transistor 332, has transitioned to the bias voltage level. Once the PFET power supply transistor 332 in the second stage 330 is turned on, the primary inverter 335 of the second stage 330 can generate and output a second pull-down pre-driver signal 336 that is inverted and delayed with respect to the input signal 301. In the last stage 340, the PFET power supply transistor 342 does not turn on until the second pull-down pre-driver signal 336 from the primary inverter 335 of the second stage 330 has transitioned from the low voltage level to the high voltage level and the output from the delay inverter 341, which is applied to the gate of the PFET power supply transistor 342, has transitioned to the bias voltage level. Once the PFET power supply transistor 342 in the last stage 340 is turned on, the primary inverter 345 of the last stage 340 can generate and output the last pull-down pre-driver signal 346 that is inverted and further delayed with respect to the input signal 301. The last pull-down pre-driver signal 346 output from the last stage 340 can be applied to the second switch 312 in a feedback loop 351. Thus, the last pull-down pre-driver signal 346 can control the second switch 312 (e.g., another PFET or some other suitable type of switch) and thereby the on/off state of the switching bias circuit 310. Thus, when this last pull-down pre-driver signal 346 transitions from the low voltage level back to the high voltage level, the second switch 312 can turn off the switching bias circuit 310. It should be noted that in such a pull-down pre-driver 300, the switch point of the delay inverters 331, 341 is raised up to between the bias voltage and VDD because VSS is not used as a power supply. This helps increase the delay of the delay inverters. Otherwise, multiple inverting stages will be needed to create delay.

It should be noted that in each of the pre-drivers 200/300 described above and illustrated in FIGS. 2 and 3, respectively, the switching bias circuit 210/310 can include a single bias voltage node 214/314 at a junction between adjacent resistors and directly electrically connected to each of the stages. Alternatively, the switching bias circuit can include: multiple bias voltage nodes 214/314 at junctions between adjacent resistors; and a multiplexor 215/315, which can be controlled by a control signal in order to selectively electrically connect one of the multiple bias voltage nodes to each the stages 220/320, 230/330, 240/340 in order to tune delay and transition times of the pre-driver signals 226/326, 236/336, 246/346. Each of the pre-drivers 200/300 can also optionally incorporate a bypass circuit (not shown) that is configured to allow for operation in a bypass mode. During the bypass mode, transitioning of the delay signals can be forced to occur concurrently.

Figure 4:
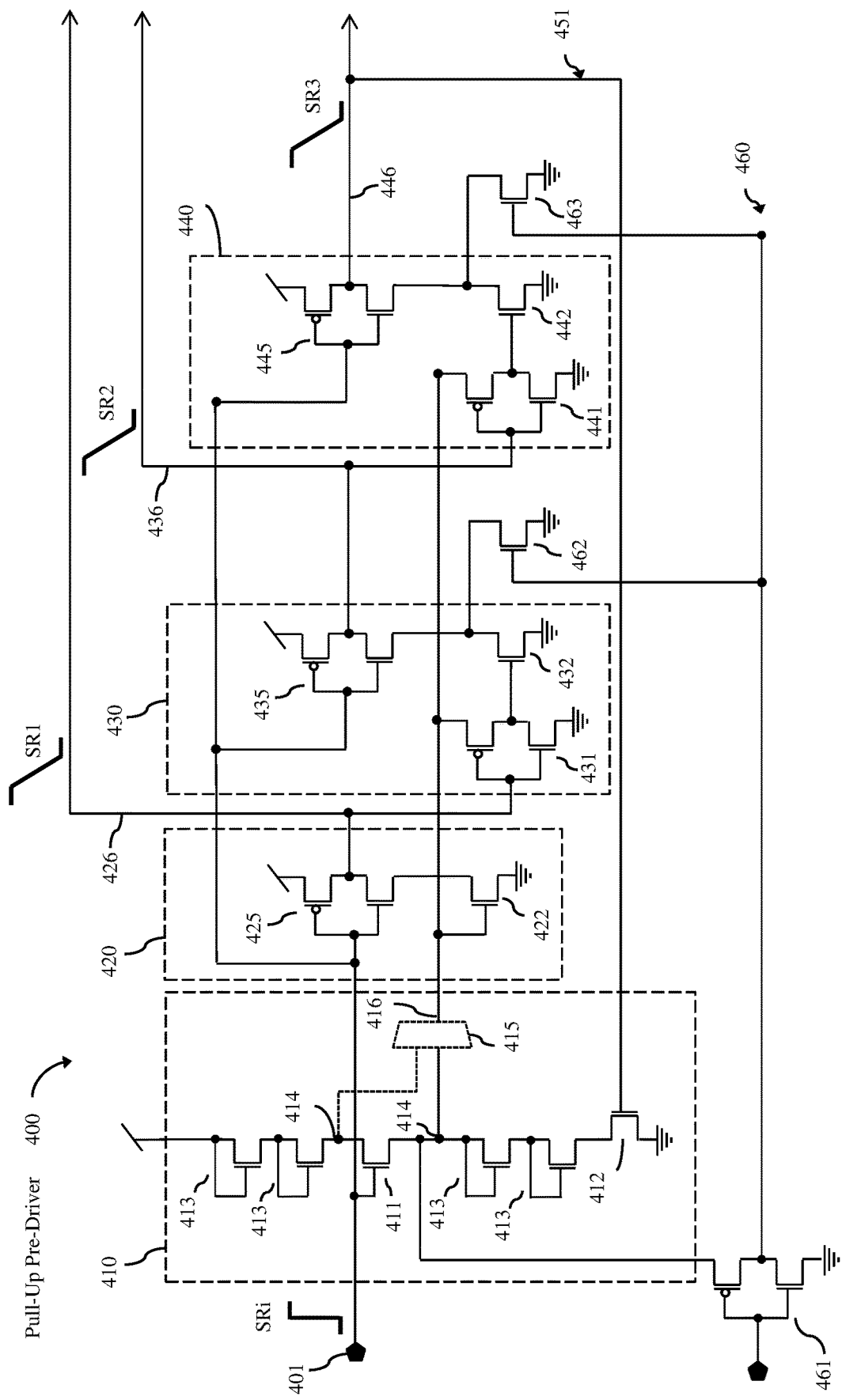
FIG. 4 is a schematic diagram illustrating an embodiment of a pull-up pre-driver.

FIG. 4 is a schematic diagram illustrating one specific embodiment of a pull-up pre-driver 400 for the pull-up path of an output driver.

The pull-up pre-driver 400 can include multiple signal generation stages 420, 430, 440 for generating and outputting pull-up pre-driver signals 426, 436, 446, respectively, based on an input signal 401. The pull-up pre-driver 400 can also include a local switching bias circuit 410 for generating and supplying a bias voltage 416, which is at some specific bias voltage level within a range from approximately one-half VDD to VDD, to each the stages during generation of the pull-up pre-driver signals 426, 436, 446.

The switching bias circuit 410 can include a group of series-connected resistors. At or near one end, the group of series-connected resistors can be connected by a first switch 411 to a positive voltage rail (e.g., at VDD). At or near the other end, the group of series-connected resistors can be connected by a second switch 412 to a ground rail (or, alternatively, a negative voltage rail) (e.g., at VSS). In this specific embodiment, the switching bias circuit 410 can include a group (also referred to herein as a chain) of n-type field effect transistors (NFETs) that are electrically connected in series between VDD and VSS. Two of the NFETs in the chain can be configured as on/off switches 411 and 412. That is, a first NFET switch 411 can be in the chain at or near the end closest to VDD and a second NFET switch 412 can be in the chain at or near the end closest to VSS. All of the others NFETs in the chain can be diode-connected transistors 413. Those skilled in the art will recognize that diode-connected transistors are field effect transistors whose gate and drain region are shorted together. Thus, functionally, diode-connected transistors are resistors.

The first NFET switch 411 can be controlled by the input signal 401 to the pull-up pre-driver 400 and the second NFET switch 412 can be controlled by the last pull-up pre-driver signal 446, which is output by the last stage 440. Thus, the switching bias circuit 410 is only turned on when needed in order to reduce leakage. The switching bias circuit 410 can further include a bias voltage node 414 at a junction between adjacent NFETs in the group. When turned on, the switching bias circuit 410 can generate (i.e., can be adapted to generate, can be configured to generate, etc.) a bias voltage 416 at the bias voltage node 414. This bias voltage 416 can be at some specific bias voltage level within a range from approximately one-half VDD to VDD (e.g., due to placement of the bias voltage node along the chain closer to VDD than VSS). It should be noted that the number of diode-connected transistors shown is not intended to be limiting. Any suitable number of diode-connected transistors could be employed in order to achieve the desired bias voltage.

The multiple signal generation stages can include: a first stage 420 (also referred to herein as an inverter only stage); a second stage 430 (also referred to herein as a delay/inverter stage); and a last stage 440 (also referred to herein as an additional delay/inverter stage). Each stage 420, 430, 440 can receive the same input signal 401 and can generate and output a corresponding pull-up pre-driver signal 426, 436, 446. The pull-up pre-driver signals 426, 436, 446 can all be inverted with respect to the input signal 401 and can transition in sequence. That is, the first pull-up pre-driver signal 426 can be inverted with respect to the input signal 401, the second pull-up pre-driver signal 436 can be inverted and delayed with respect to the input signal 401, and, finally, the last pull-up pre-driver signal 446 can be inverted and further delayed with respect to the input signal 401. Additionally, transition of the pull-up pre-driver signals 426, 436, 446 can occur at a slower rate than the input signal 401. That is, the slew rate of the pull-up pre-driver signals 426, 436, 446 can be relatively long as compared to the slew rate of the input signal 401.

To accomplish this, each stage 420, 430, 440 can include a primary inverter 425, 435, 445, which is configured to receive and invert the input signal 401. Each stage 420, 430, 440 can also include an NFET power supply transistor 422, 432, 442, which is electrically connected to the primary inverter 425, 435, 445 and which is configured to supply power to the primary inverter 425, 435, 445. Specifically, the primary inverter 425, 435, 445 and NFET power supply transistor 422, 432, 442 can be connected in series between VDD and VSS. That is, the NFET power supply transistor 422, 432, 442 can have a source region electrically connected to VSS. The primary inverter 425, 435, 445 can include a PFET having a source region electrically connected to VDD and an NFET connected in series between a drain region of the PFET and a drain region of the NFET power supply transistor. The gates of the PFET and NFET of each primary inverter 425, 435, 445 can be electrically connected to an input node for the pull-up pre-driver 400. Thus, within each stage 420, 430, 440, when the NFET power supply transistor 422, 432, 442 is turned on, a pull-up pre-driver signal 426, 436, 446 that is inverted with respect to the input signal 401 can be output by the primary inverter 425, 435, 445 on an output node at a junction between the PFET and NFET of that primary inverter 425, 435, 445.

The bias voltage node 414 can be electrically coupled to (i.e., electrically connected to) each of the stages 420, 430, 440.

Specifically, in the first stage 420, the gate of the NFET power supply transistor 422 can be electrically connected to the bias voltage node 414 (either directly or through a multiplexor 415, as discussed below) such that, when the switching bias circuit 410 is turned on and the bias voltage 416 (which as mentioned above is at a specific bias voltage level within a range from approximately one-half VDD to VDD) is applied to the gate of the NFET power supply transistor 422, the NFET power supply transistor 422 weakly turns on. Then the primary inverter 425 can generate and output a first pull-up pre-driver signal 426 that is inverted with respect to the input signal 401.

The second and last stages 430 and 440 can also include a delay inverter 431, 441. The delay inverter 431, 441 can include a PFET and an NFET electrically connected in series between the bias voltage node 414 (not VDD) and VSS. The gates of the PFET and NFET of the delay inverter 431, 441 can be electrically connected to the output node of the primary inverter from the previous stage. Thus, the input to the delay inverter 431, 441 is the pull-up pre-driver signal from the primary inverter of the previous stage. That is, the input to the delay inverter 431 in the second stage 430 is the first pull-up pre-driver signal 426 from the primary inverter 425 of the first stage 420 and the input to the delay inverter 441 of the last stage 440 is the second pull-up pre-driver signal 436 from the primary inverter 435 of the second stage 430. The gate of the NFET power supply transistor 432, 442 can be electrically connected to the junction between the PFET and the NFET of the delay inverter 431, 441. That is, the output of the delay inverter 431, 441 will be applied to the gate of the NFET power supply transistor 432, 442 in the same stage 430, 440.

The switch point of the delay inverters 431, 441 is bias voltage dependent. More particularly, the switch point of the delay inverters 431, 441 is dropped to between bias voltage 416 and VSS because the bias voltage 416 is used to power the delay inverters instead of VDD. This helps to reduce delay cell size. Furthermore, the output of the delay inverters 431, 441 will be either at ground (if the voltage level of the received pull-up pre-driver signal is high) or at the bias voltage level (if the voltage level of the received pull-up pre-driver signal is low). As a result, the NFET power supply transistors 432, 442 in the second and last stages 430, 440 only turn on when the pull-up pre-driver signal from the previous stage switches from a high voltage level to a low voltage level causing the output of the delay inverter 431, 441 to transition to the bias voltage level. Thus, the same bias voltage level is used to turn on the NFET power supply transistors 422, 432, 442.

During a normal operating mode in the pull-up pre-driver 400, the first NFET switch 411 of the switching bias circuit 410 and the primary inverter 425, 435, 445 in each of the stages 420, 430, 440 can receive the same input signal 401. In response to this input signal 401 transitioning from a low voltage level (e.g., at VSS) to a high voltage level (e.g., at VDD), the first NFET switch 411 can turn on the switching bias circuit 410 to supply the bias voltage 416 through the bias voltage node 414 to each of the stages 420, 430, 440. In the first stage 420, the bias voltage 416 turns on the NFET power supply transistor 422, thereby turning on the primary inverter 425. The primary inverter 425 then generates and outputs a first pull-up pre-driver signal 426 that is inverted with respect to the input signal 401 (i.e., that transitions from the high voltage level to the low voltage level). In the second stage 430, the bias voltage 416 enables operation of the delay inverter 431; however, the NFET power supply transistor 432 does not turn on until the first pull-up pre-driver signal 426 from the primary inverter 425 of the first stage 420 has transitioned from the high voltage level to the low voltage level and the output from the delay inverter 431, which is applied to the gate of the power supply transistor 432, has transitioned to the bias voltage 416 level. Once the NFET power supply transistor 432 in the second stage 430 is turned on, the primary inverter 435 of the second stage 430 can generate and output a second pull-up pre-driver signal 436 that is inverted and delayed with respect to the input signal 401. In the last stage 440, the bias voltage 416 enables operation of the delay inverter 441; however, the NFET power supply transistor 442 does not turn on until the second pull-up pre-driver signal 436 from the primary inverter 435 of the second stage 430 has transitioned from the high voltage level to the low voltage level and the output from the delay inverter 441, which is applied to the gate of the NFET power supply transistor 442, has transitioned to the bias voltage 416 level. Once the NFET power supply transistor 442 in the last stage 440 is turned on, the primary inverter 445 of the last stage 440 can generate and output a last pull-up pre-driver signal 446 that is inverted and further delayed with respect to the input signal 401. The last pull-up pre-driver signal 446, which is output from the last stage 440, can applied to the gate terminal of the second NFET switch 412 in a feedback loop 451. Thus, when this last pull-up pre-driver signal 446 transitions from the high voltage level back to the low voltage level, the second NFET switch 412 can turn off the switching bias circuit 410.

Due to the bias voltage 416 being applied to the NFET power supply transistor 422 in the first stage 420 and further due to the configuration in the downstream stages where the outputs from the delay inverters 431, 441 are at ground or at the bias voltage level depending upon the pull-up pre-driver signal from the previous stage and where the outputs from the delay inverters 431, 441 control the on/off states of the NFET power supply transistors 432, 442, the NFET power supply transistors 422, 432, 442 in the stages 420, 430, 440, respectively, turn on in sequence and also act as weak resistors. Thus, the pull-up pre-driver signals 426, 436, 446 transition from the high voltage level to the low voltage level in sequence and also at a slower rate than that the rate at which the input signal 401 transitions. By causing the transitions in the pull-up pre-driver signals to occur in sequence and at a relatively slow rate, noise is reduced.

It should be noted that, in the pull-up pre-driver 400 of FIG. 4, the switching bias circuit 410 can include a single bias voltage node 414 at a junction between adjacent transistors in the chain and directly electrically connected to each of the stages. Alternatively, the switching bias circuit 410 can include a multiplexor 415, which has multiple inputs that are electrically connected to multiple bias voltage nodes 414 at different junctions between adjacent transistors in the chain and which has an output electrically connected to each of the stages 420, 430, 440. In this case, the multiplexor 415 can be controlled by a control signal in order to selectively electrically connect one of the multiple bias voltage nodes to each the stages 420, 430, 440 in order to tune delay and transition times of the pull-up pre-driver signals 426, 436, 446.

Optionally, the pull-up pre-driver 400 can further be configured with a bypass circuit 460 that enables operation in a bypass mode (also referred to herein as a fast mode). During the bypass mode, the bypass circuit ensures that transitioning of the pull-up pre-driver signals 426, 436, 446 from the high voltage level to the low voltage level occurs concurrently. For example, the bypass circuit 460 of the pull-up pre-driver 400 can include bypass inverter 461 electrically connected in series between the bias voltage node 414 and ground. The input to the bypass inverter 461 can be a bypass enable signal and the output can be electrically connected to the gates of additional NFETs 462 and 463. The additional NFETs can be associated with all of the stages except the first stage 420. Each additional NFET can have a source region electrically connected to ground and a drain region electrically connected to the junction between the NFET power supply transistor and the primary inverter of a given stage. Thus, for example, as shown in FIG. 4, the additional NFET 462 can have a source region electrically connected to ground and a drain region electrically connected to the junction between the NFET power supply transistor 432 and the primary inverter 435 of the second stage 430. Another additional NFET 463 can have a source region electrically connected to ground and a drain region electrically connected to the junction between the NFET power supply transistor 442 and the primary inverter 445 of the last stage 440. With this configuration, if/when the bypass signal is low, the additional NFETs will turn on in order to enable the primary inverters 435, 445 in the later stages 430, 440 concurrently with the primary inverter 425 in the first stage 420 such that all of the pull-up pre-driver signals 426, 436, 446 will transition from the high voltage level to the low voltage level concurrently.

Figure 5:
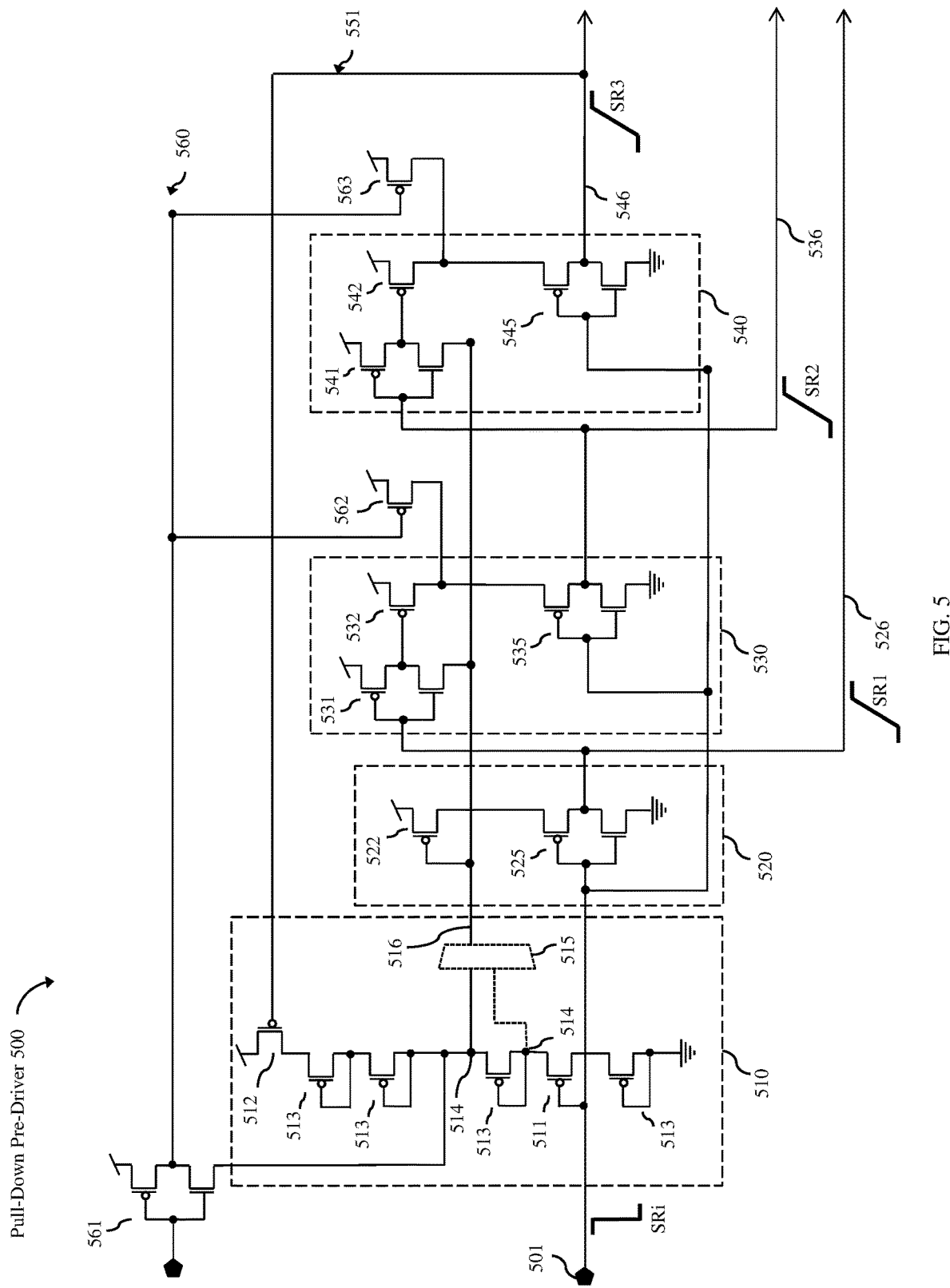
FIG. 5 is a schematic diagram illustrating an embodiment a pull-down pre-driver.

FIG. 5 is a schematic diagram illustrating one specific embodiment of a pull-down pre-driver 500 for the pull-down path of an output driver.

The pull-down pre-driver 500 includes multiple signal generation stages 520, 530, 540 for generating and outputting pull-down pre-driver signals 526, 536, 546, respectively, based on an input signal 501. The pull-down pre-driver can also include a local switching bias circuit 510 for generating a supplying a bias voltage 516, which is at some specific bias voltage level within a range from VSS to approximately one-half VDD, to each of the stages during generation of the pull-down pre-driver signals 526, 536, 546.

The switching bias circuit 510 can include a group of series-connected resistors. At or near one end, the group of series-connected resistors can be connected by a first switch 511 to a ground rail (or, alternatively, a negative voltage rail) (e.g., at VSS). At the other end, the group of series-connected resistors can be connected by a second switch 512 to a positive voltage rail (e.g., at VDD). More specifically, in this embodiment, the switching bias circuit 510 can include a group (also referred to herein as a chain) of p-type field effect transistors (PFETs) that are connected in series between VDD and VSS. Two of the PFETs in the chain can be configured as on/off switches 511, 512. That is, a first PFET switch 511 can be in the chain at or near the end closest to VSS and a second PFET switch 512 can be in the chain at or near the end closest to VDD. All of the others PFETs in the chain can be diode-connected transistors 513. Those skilled in the art will recognize that diode-connected transistors are field effect transistors whose gate and drain region are shorted together. Thus, functionally, diode-connected transistors are resistors.

The first PFET switch 511 can be controlled by the input signal 501 to the pull-down pre-driver 500 and the second PFET switch 512 can be controlled by the last pull-down pre-driver signal 546, which is output by the last stage 540. Thus, the switching bias circuit 510 is only turned on when needed in order to reduce leakage. The switching bias circuit 510 can further include a bias voltage node 514 at a junction between adjacent PFETs in the group. When turned on, the switching bias circuit 510 can generate (i.e., can be adapted to generate, can be configured to generate, etc.) a bias voltage 516 at some desired level at the bias voltage node 514. This bias voltage 416 can be at some specific bias voltage level within a range from VSS to approximately one-half VDD (e.g., due to placement of the bias voltage node along the chain closer to VSS than VDD). It should be noted that the number of diode-connected transistors shown is not intended to be limiting. Any suitable number of diode-connected transistors could be employed in order to achieve the desired bias voltage.

The multiple signal generation stages can include: a first stage 520 (also referred to herein as an inverter only stage); a second stage 530 (also referred to herein as a delay/inverter stage); and a last stage 540 (also referred to herein as an additional delay/inverter stage). Each stage 520, 530, 540 can receive the same input signal 501 and can generate and output a corresponding pull-down pre-driver signal 526, 536, 546. The pull-down pre-driver signals 526, 536, 546 can all be inverted with respect to the input signal 501 and can transition in sequence. That is, the first pull-down pre-driver signal 526 can be inverted with respect to the input signal 501, the second pull-down pre-driver signal 536 can be inverted and delayed with respect to the input signal 501, and, finally, the last pull-down pre-driver signal 546 can be inverted and further delayed with respect to the input signal 501. Additionally, transition of the pull-down pre-driver signals 526, 536, 546 can occur at a slower rate than the input signal 501. That is, the slew rate of the pull-down pre-driver signals 526, 536, 546 can be relatively long as compared to the slew rate of the input signal 501.

To accomplish this, each stage 520, 530, 540 can include a primary inverter 525, 535, 545, which is configured to receive and invert the input signal 501. Each stage 520, 530, 540 can also include a PFET power supply transistor 522, 532, 542, which is electrically connected to the primary inverter 525, 535, 545 and which is configured supply power to the primary inverter 525, 535, 545. Specifically, a PFET power supply transistor 522, 532, 542 and the primary inverter 525, 535, 545 can be connected in series between the VDD and VSS. That is, the PFET power supply transistor 522, 532, 542 can have a source region electrically connected to VDD. The primary inverter 525, 535, 545 can include an NFET having a source region electrically connected to VSS and a PFET connected in series between a drain region of the NFET and a drain region of the PFET power supply transistor. The gates of the PFET and NFET of each primary inverter 525, 535, 545 can be electrically connected to an input node for the pull-down pre-driver 500. Thus, within each stage 520, 530, 540, when the PFET power supply transistor 522, 532, 542 is turned on, a pull-down pre-driver signal 526, 536, 546 that is inverted with respect to the input signal 501 can be output by the primary inverter 525, 535, 545 at an output node that is at a junction between the PFET and NFET of that primary inverter.

The bias voltage node 514 can be electrically coupled to (i.e., electrically connected to) each of the stages 520, 530, 540.

Specifically, in the first stage 520, the gate of the PFET power supply transistor 522 can be electrically connected to the bias voltage node 514 (either directly or through a multiplexor 515, as discussed below) such that, when the switching bias circuit 510 is turned on and the bias voltage 516 (which as mentioned above is at some specific bias voltage level within a range from VSS to approximately one-half VDD) is applied to the gate of the PFET power supply transistor 522, the PFET power supply transistor 522 weakly turns on. Then the primary inverter 525 can generate and output a first pull-down pre-driver signal 526 that is inverted with respect to the input signal 501.

The second and last stages 530 and 540 can also include a delay inverter 531, 541. The delay inverter 531, 541 can include a PFET and an NFET electrically connected in series between the VDD and the bias voltage node 514 (not VSS). The gates of the PFET and NFET of the delay inverter 531, 541 can be electrically connected to the output node of the primary inverter from the previous stage. Thus, the input to the delay inverter 531, 541 is the pull-down pre-driver signal from the primary inverter of the previous stage. That is, the input to the delay inverter 531 in the second stage 530 is the first pull-down pre-driver signal 526 from the primary inverter 525 of the first stage 520 and the input to the delay inverter 541 of the last stage 540 is the second pull-down pre-driver signal 536 from the primary inverter 535 of the second stage 530. The gate of the PFET power supply transistor 532, 542 can be electrically connected to the junction between the PFET and the NFET of the delay inverter 531, 541. That is, the output of the delay inverter 531, 541 will be applied to the gate of the PFET power supply transistor 532, 542 in the same stage 530, 540.

The switch point of the delay inverters 531, 541 is bias voltage dependent. More particularly, the switch point of the delay inverters is increased to between the bias voltage 516 and VDD because the bias voltage 516 is used to power the delay inverters instead of VSS. This helps to reduce delay cell size. Furthermore, the output of the delay inverters 531, 541 will be either at VDD (if the voltage level of the received pull-down pre-driver signal is low) or at the bias voltage level (if the voltage level of the received pull-down pre-driver signal is high). As a result, the PFET power supply transistors 532, 542 in the second and last stages 530, 540 only turn on when the pull-down pre-driver signal from the previous stage switches from a low voltage level to a high voltage level causing the output of the delay inverter 531, 541 to transition to the bias voltage level. Thus, the same bias voltage level is used to turn on the PFET power supply transistors 522, 532, 542.

During a normal operating mode in the pull-down pre-driver 500, the first PFET switch 511 of the switching bias circuit 510 and the primary inverter 525, 535, 545 in each of the stages 520, 530, 540 can receive the same input signal 501. In response to this input signal 501 transitioning from a high voltage level (e.g., at VDD) to a low voltage level (e.g., at VSS), the first PFET switch 511 can turn on the switching bias circuit 510 to supply the bias voltage 516 to each of the stages 520, 530, 540. In the first stage 520, the bias voltage 516 turns on the PFET power supply transistor 522, thereby turning on the primary inverter 525. The primary inverter 525 then generates and outputs a first pull-down pre-driver signal 526 that is inverted with respect to the input signal 501 (i.e., that transitions from the low voltage level to the high voltage level). In the second stage 530, the bias voltage 516 enables operation of the delay inverter 531; however, the PFET power supply transistor 532 does not turn on until the first pull-down pre-driver signal 526 from the primary inverter 525 of the first stage 520 has transitioned from the low voltage level to the high voltage level and the output from the delay inverter 531, which is applied to the gate of the power supply transistor 532, has transitioned to the bias voltage level. Once the PFET power supply transistor 532 in the second stage 530 is turned on, the primary inverter 435 of the second stage 530 can generate and output a second pull-down pre-driver signal 536 that is inverted and delayed with respect to the input signal 501. In the last stage 540, the bias voltage 516 enables operation of the delay inverter 541; however, the PFET power supply transistor 542 does not turn on until the second pull-down pre-driver signal 536 from the primary inverter 535 of the second stage 530 has transitioned from the low voltage level to the high voltage level and the output from the delay inverter 541, which is applied to the gate of the PFET power supply transistor 542, has transitioned to the bias voltage level. Once the PFET power supply transistor 542 in the last stage 540 is turned on, the primary inverter 545 of the last stage 540 can generate and output a last pull-down pre-driver signal 546 that is inverted and further delayed with respect to the input signal 501. As mentioned above, the last pull-down pre-driver signal 546, which is output from the last stage 540, can be applied to the gate terminal of the second PFET switch 512 in a feedback loop 551. Thus, when this last pull-down pre-driver signal 546 transitions from the low voltage level back to the high voltage level, the second PFET switch 512 can turn off the switching bias circuit 510.

Due to the bias voltage 516 being applied to the PFET power supply transistor 522 in the first stage 520 and further due to the configuration in the downstream stages where the outputs from the delay inverters 531, 541 are at the bias voltage level or VDD depending upon the pull-down pre-driver signal from the previous stage and where the outputs from the delay inverters 531, 541 control the on/off states of the PFET power supply transistors 532, 542, the PFET power supply transistors 522, 532, 542 in the stages 520, 530, 540, respectively, turn on in sequence and also act as weak resistors. Thus, the pull-down pre-driver signals 526, 436, 546 from transition from the low voltage level to the high voltage level in sequence and also at a slower rate than that the rate at which the input signal 501 transitions. By causing the transitions in the pull-down pre-driver signals to occur in sequence and at a relatively slow rate, noise is reduced.

It should be noted that, in the pull-down pre-driver 500 of FIG. 5, the switching bias circuit 510 can include a single bias voltage node 514 at a junction between adjacent transistors in the chain and directly electrically connected to each of the stages. Alternatively, the switching bias circuit 510 can include a multiplexor 515, which has multiple inputs that are electrically connected to multiple bias voltage nodes 514 at different junctions between adjacent transistors in the chain and which has an output electrically connected to each of the stages 520, 530, 540. In this case, the multiplexor 515 can be controlled by a control signal in order to selectively electrically connect one of the multiple bias voltage nodes to each the stages 520, 530, 540 in order to tune delay and transition times of the pull-down pre-driver signals 526, 536, 546.

Optionally, the pull-down pre-driver 500 can further be configured with a bypass circuit 560 that enables operation in a bypass mode (also referred to herein as a fast mode). During the bypass mode, the bypass circuit ensures that transitioning of the pull-down pre-driver signals 526, 536, 546 from the low voltage level to the high voltage level occurs concurrently. For example, the bypass circuit 560 of the pull-down pre-driver 500 can include bypass inverter 561 electrically connected in series between the positive voltage rail and the bias voltage node 514. The input to the bypass inverter 561 can be a bypass enable signal and the output can be electrically connected to the gates of additional PFETs 562 and 563. The additional PFETs can be associated with all of the stages except the first stage 520. Each additional PFET can have a source region electrically connected to a positive voltage rail and a drain region electrically connected to the junction between the PFET power supply transistor and the primary inverter of a given stage. Thus, for example, as shown in FIG. 5, the additional PFET 562 can have a source region electrically connected to the positive voltage rail and a drain region electrically connected to the junction between the PFET power supply transistor 532 and the primary inverter 535 of the second stage 530. Another additional PFET 563 can have a source region electrically connected to the positive voltage rail and a drain region electrically connected to the junction between the PFET power supply transistor 542 and the primary inverter 545 of the last stage 540. With this configuration, if/when the bypass signal is high, the additional PFETs will turn on in order to enable the primary inverters 535, 545 in the later stages 530, 540 concurrently with the primary inverter 525 in the first stage 520 such that all of the pull-down pre-driver signals 526, 536, 546 will transition from the low voltage level to the high voltage level concurrently.

It should be understood that in each of the pre-driver embodiments described above and illustrated in FIGS. 2-5 the specific location(s) of the bias node(s) 214/314/414/514 within the chain of resistors are shown for illustration purposes and not intended to be limiting. The goal of the location of any given bias node is to achieve a specific bias voltage that is optimal for operation of the different stages of the pre-driver. As mentioned above, for the disclosed pull-up pre-driver 200/400, the bias voltage 216/416 on the bias node 214/414 should be at some specific level within a range from approximately one-half VDD to VDD. This specific level should be sufficiently high to turn on the NFET power supply transistor 222/422 in the first stage 220/420 and to ensure that the delay inverters 231/431 and 241/441 in the second and last stages operate safely in all process, voltage and temperature conditions. As mentioned above, for the disclosed pull-down pre-driver 300/500, the bias voltage 316/516 on the bias node 314/514 should be at some specific level within a range from VSS to approximately one-half VDD. This specific level should be sufficiently low to turn on the PFET power supply transistor 322/522 in the first stage 320/520 and to ensure that the delay inverters 331/531, 341/541 in the second and last stages operate safely in all process, voltage and temperature conditions.

Newly Added Detailed Description

The previous paragraphs of the detailed description were included in the parent application and disclosed embodiments of a pre-driver circuit (also referred to as a pre-driver, e.g., either a pull-up pre-driver or a pull-down pre-driver) for an output driver. Each of those previously disclosed pre-driver circuit embodiments included multiple signal generation stages for generating and outputting multiple different pre-driver signals, respectively, and a local switching bias circuit for providing the same bias voltage to each of those signal generation stages. Since, in the previously disclosed embodiments, the same bias voltage was applied to each of the staged, the ability to individually tune the delay and slew rate of each pre-driver signal was somewhat limited.

Newly disclosed in this continuation-in-part application are additional pre-driver circuit embodiments for an output driver. These additional embodiments are similar to the pre-driver circuit embodiments disclosed in the parent application and, more particularly, are alternative configurations for those previously disclosed embodiments. In the pre-driver circuit embodiments disclosed herein instead of the signal generation stages all receiving the same specific bias voltage from a single local switching bias circuit, they can receive different specific bias voltages from different local switching bias circuits or from the same local switching bias circuit via a multi-input/multi-output multiplexor. By allowing different specific bias voltages to be supplied to the different signal generation stages, the delays and transition times (i.e., slew rates) of the pre-driver signals can be individually varied (i.e., finely tuned, adjusted, etc.) to further reduce noise.

FIGS. 6-9 are schematic diagram illustrating alternative configurations 200.1, 300.1, 400.1, 500.1 for the pre-drivers 200, 300, 400, 500 shown in FIGS. 2-5, respectively. FIGS. 10-13 are schematic diagram illustrating different alternative configurations 200.2, 300.2, 400.2, 500.2 for the pre-drivers 200, 300, 400, 500 shown in FIGS. 2-5, respectively. Thus, the pre-drivers 200.1 of FIG. 6, 200.2 of FIG. 10, 400.1 of FIG. 8 and 400.2 of FIG. 12 are pull-up pre-drivers and the pre-drivers 300.1 of FIG. 7, 300.2 of FIG. 11, 500.1 of FIG. 9, and 500.2 of FIG. 13 are pull-down pre-drivers.

Referring to FIGS. 6-13, all the pre-drivers disclosed herein include multiple signal generation stages (i.e., two or more signal generation stages) for generating and outputting pre-driver signals, respectively. These signal generation stages can include: a first signal generation stage 220, 320, 420, 520 for generating and outputting a first pre-driver signal 226, 326, 426, 526; a second signal generation stage 230, 330, 430, 530 for generating and outputting a second pre-driver signal 236, 336, 436, 536; and a last signal generation stage 240, 340, 440, 540 for generating and outputting a last pre-driver signal 246, 346, 446, 546. The signal generation stages 220-240, 320-340, 420-440, 520-540 be configured in essentially the same manner as described in detail above and illustrated in the drawings with respect to the pre-drivers 200, 300, 400, 500, except as follows.

Figure 6:
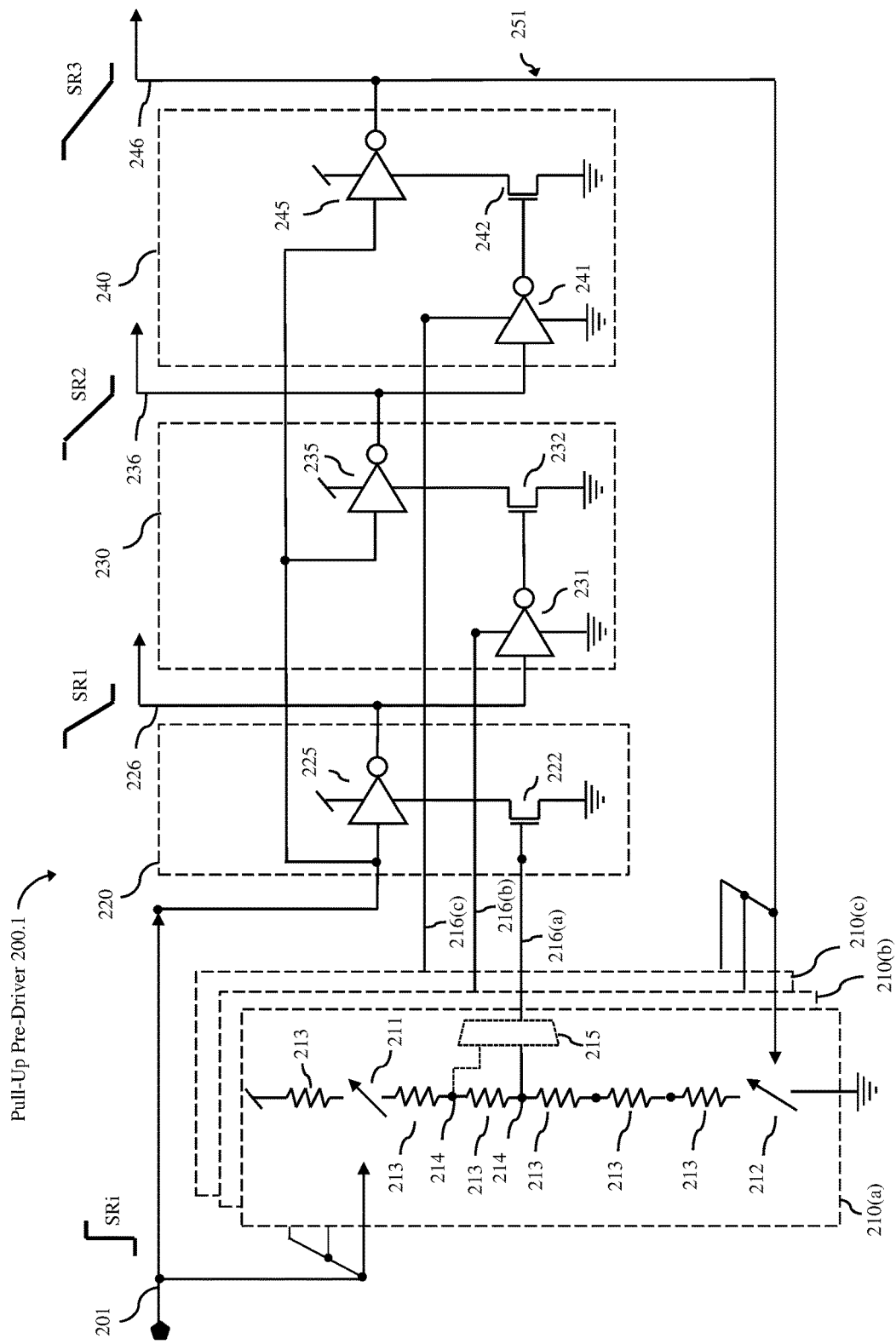
FIGS. 6-9 are schematic diagrams illustrating the embodiments of the pre-driver circuits of FIGS. 2-5, respectively, alternatively configured with multiple local switching bias circuits so that different bias voltages can be supplied to the different signal generation stages.
Figure 7:
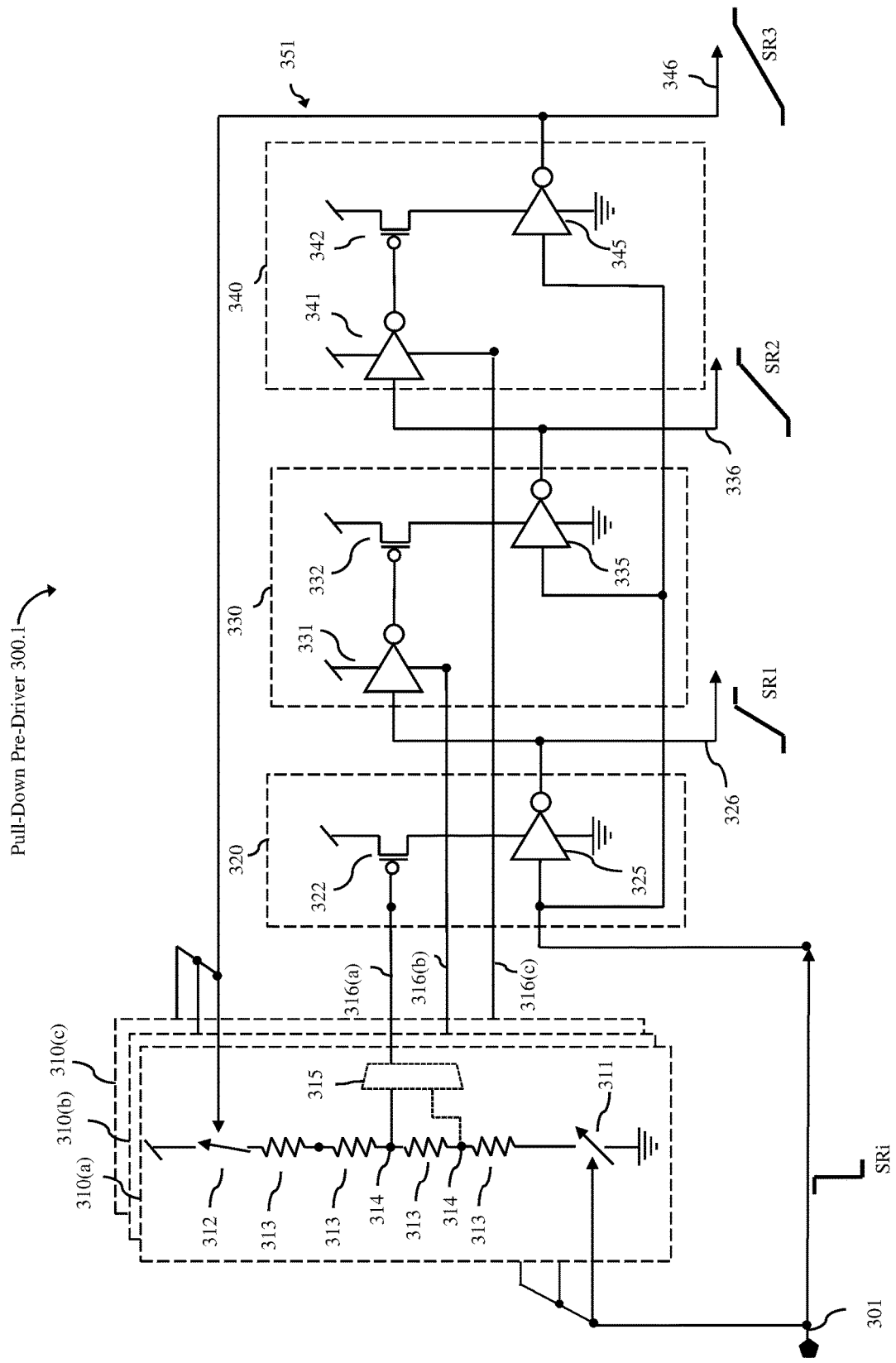
Figure 8:
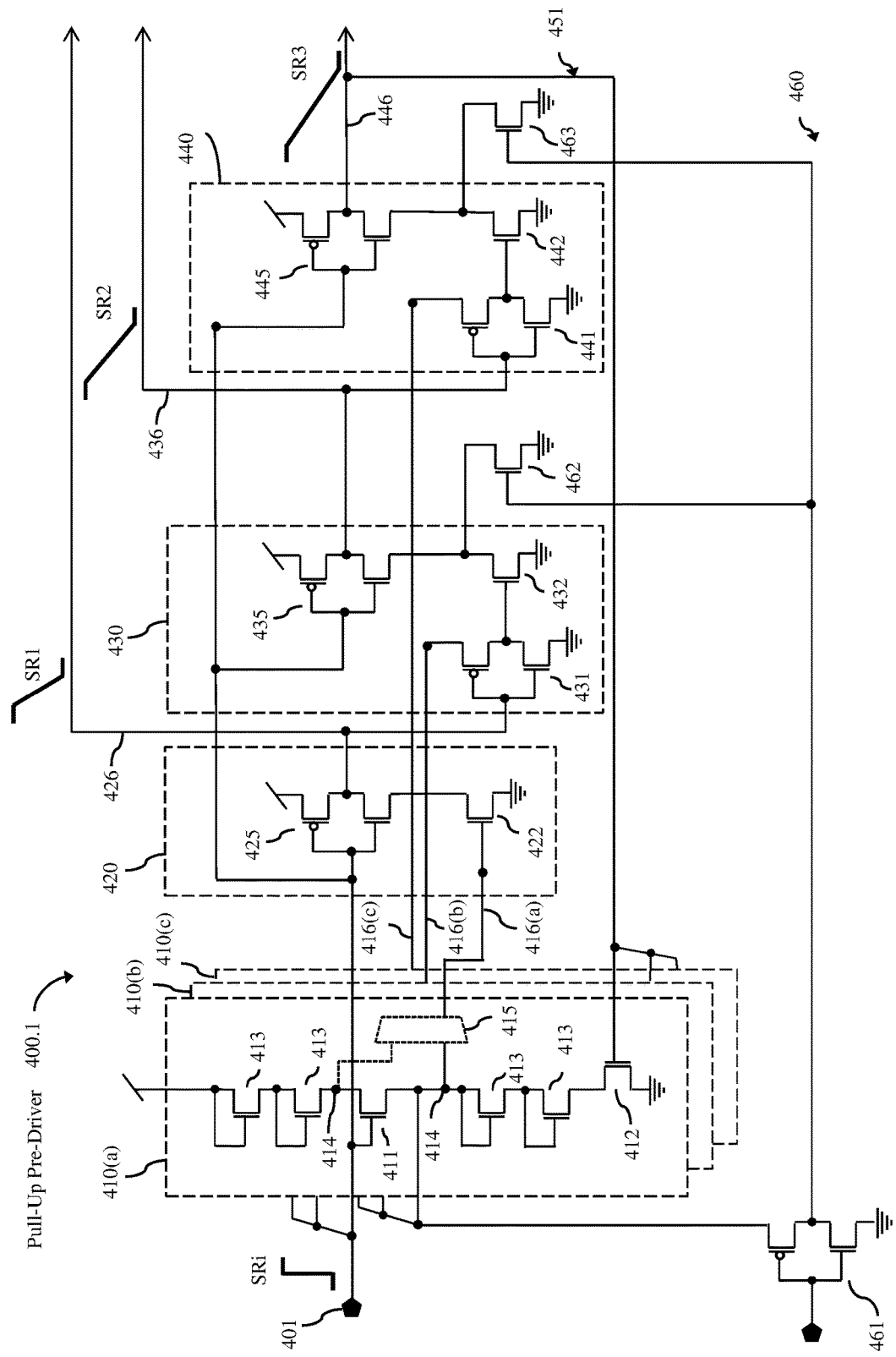
Figure 9:
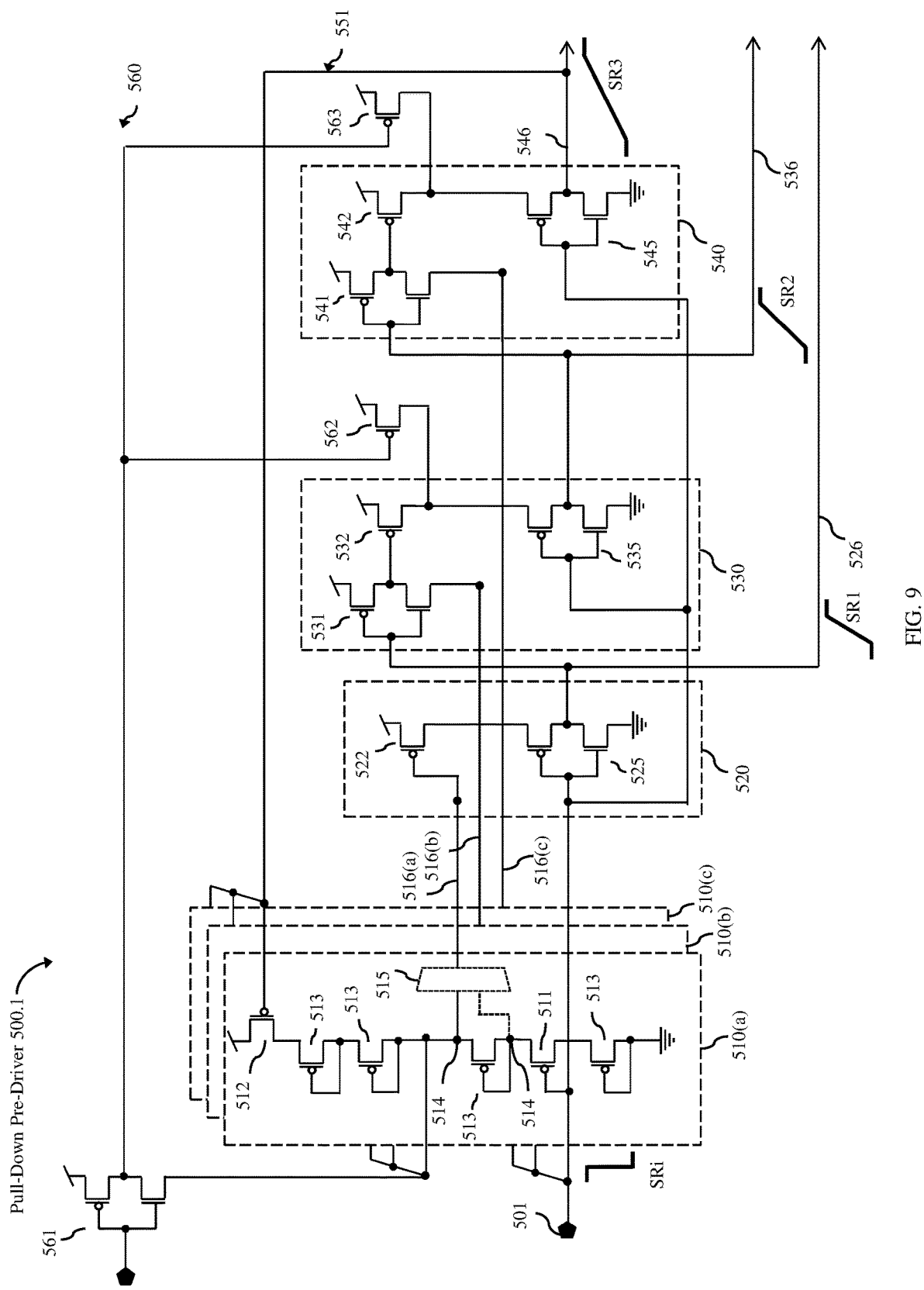

In the pre-drivers 200.1 of FIG. 6, 300.1 of FIG. 7, 400.1 of FIG. 8, and 500.1 of FIG. 9, instead of the signal generation stages all being electrically connected to the same bias voltage node of the same local switching bias circuit (either directly or via an optional multiplexor), the signal generation stages 220/230/240, 320/330/340, 420/430/440, 520/530/540 are electrically connected to different specific bias voltage nodes in different local switching bias circuits 210(a)/210(b)/210(c), 310(a)/310(b)/310(c), 410(a)/410(b)/410(c), 510(a)/510(b)/510(c) (either directly or via an optional multi-input/single output multiplexor 215, 315, 415, 515), respectively.

Figure 10:
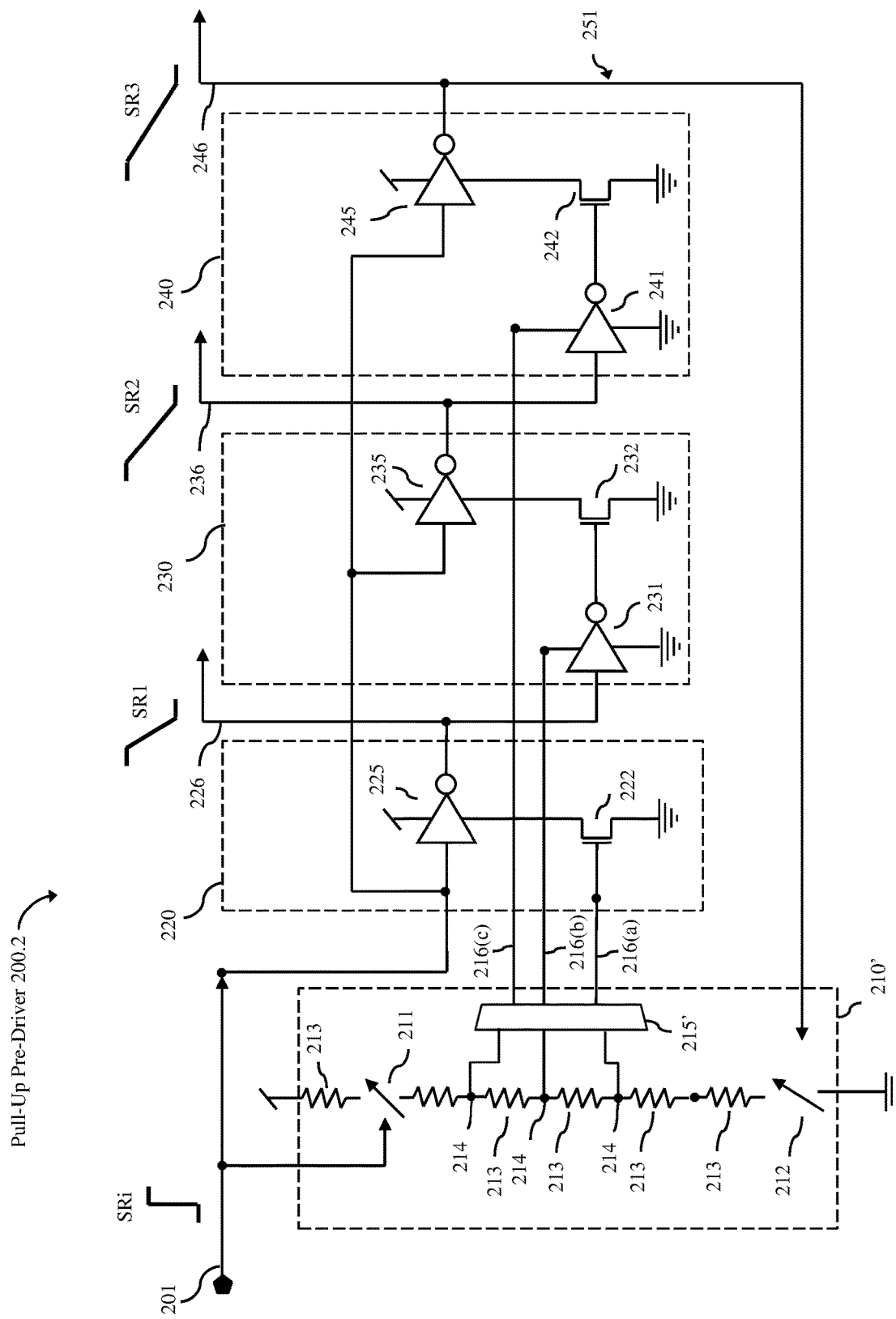
FIGS. 10-13 are schematic diagrams illustrating the embodiments of the pre-driver circuits of FIGS. 2-5, respectively, alternatively configured with a multi-input/multi-output multiplexor with inputs connected to bias voltage nodes of a local switching bias circuit and outputs connected to the signal generations so that different bias voltages can be selectively supplied to the different signal generation stages.
Figure 11:
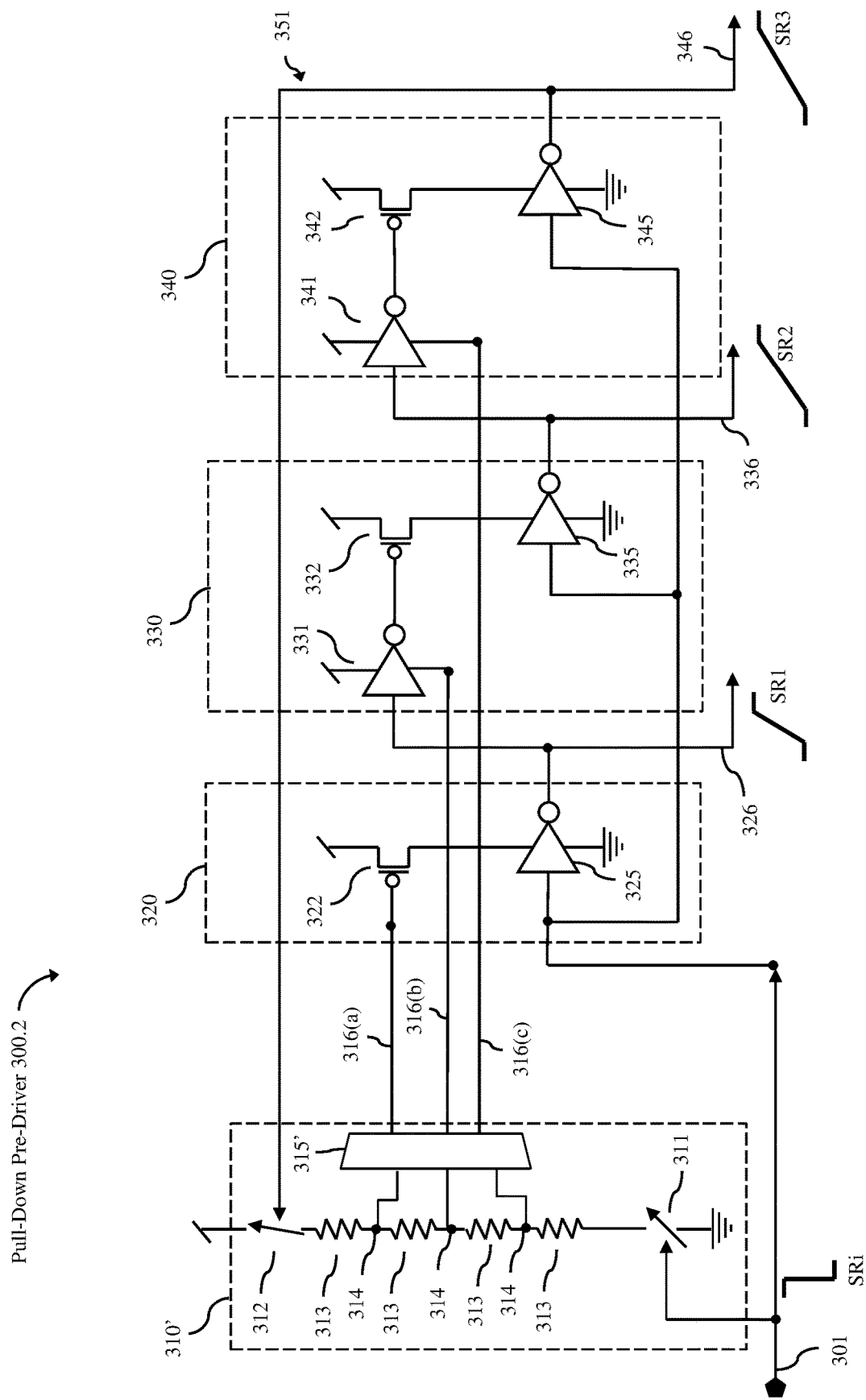
Figure 12:
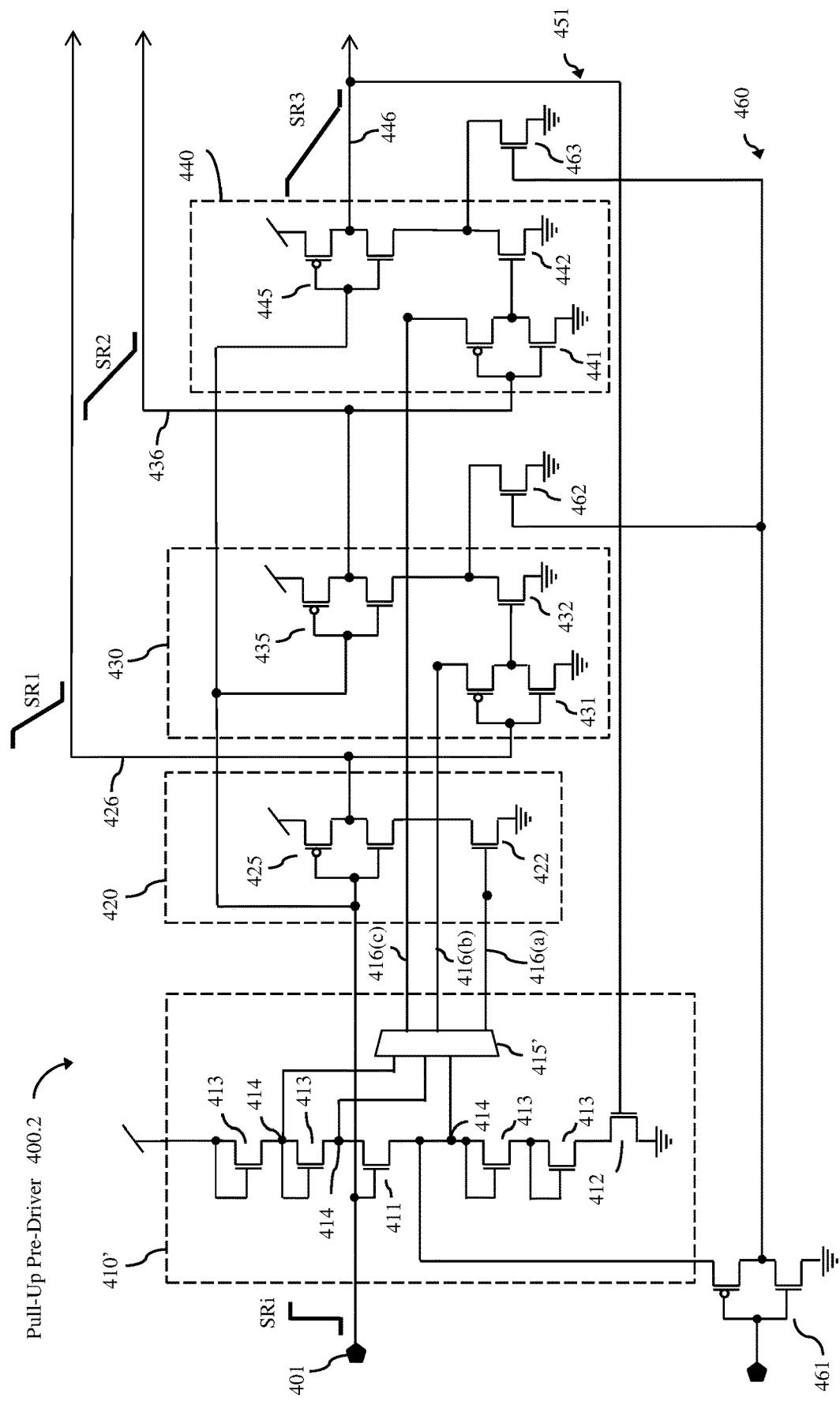
Figure 13:
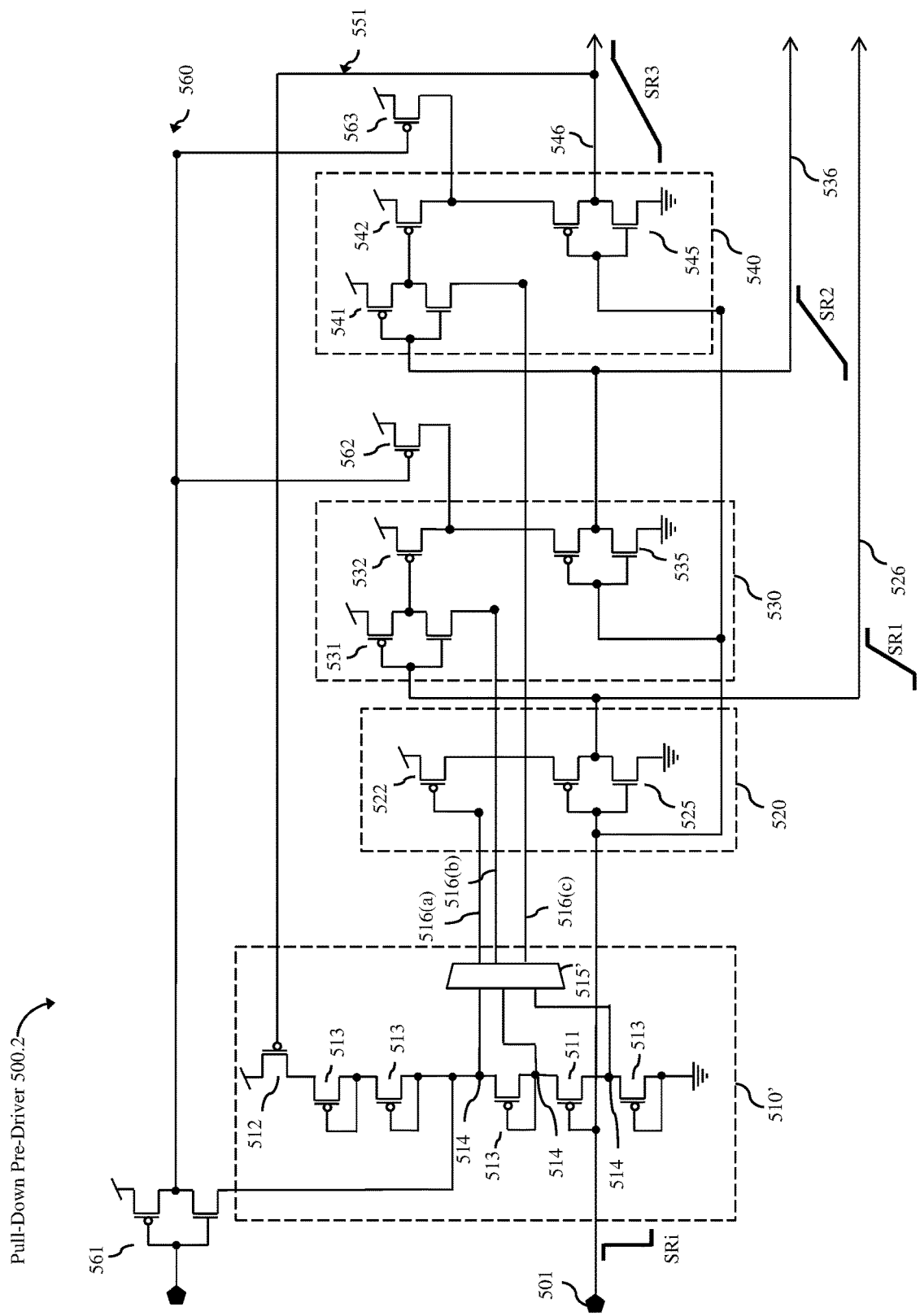

In the pre-drivers 200.2 of FIG. 10, 300.2 of FIG. 11, 400.2 of FIG. 12, and 500.2 of FIG. 13, a single local switching bias circuit 210', 310', 410', 510' is employed. However, this local switching bias circuit includes multiple bias voltage nodes 214, 314, 414, 514 and a multi-input/multi-output multiplexor 215', 315', 415', 515', which has inputs connected to the bias voltage nodes, respectively, and outputs connected to each of the signal generation stages, respectively, so that different specific bias voltages can be selectively supplied to the signal generation stages.

More specifically, referring to FIGS. 6-9, the pre-drivers 200.1, 300.1, 400.1, 500.1 can include multiple local switching bias circuits 210(a)-210(c), 310(a)-310(c), 410(a)-410(c), 510(a)-510(c) (e.g., one for each signal generation stage). Each local switching bias circuit 210(a)-210(c), 310(a)-310(c), 410(a)-410(c), 510(a)-510(c) can be configured in essentially the same manner as the local switching bias circuit 210, 310, 410, 510 described in detail above and illustrated in the drawings with respect to the pre-drivers 200, 300, 400, 500 in order to generate a specific bias voltage on a bias voltage node 214, 314, 414, 514 when in an ON-state. That is, each local switching bias circuit can include a resistor chain (i.e., a group of series-connected resistors 213, 313, 413, 513, such as a group of series-connected, diode-connected n-type field effect transistors 413 in the pull-up pre-driver 400.1 or a group of series-connected, diode-connected p-type field effect transistors 513 in the pull-down pre-driver 500.1) between a positive voltage rail and a ground rail. The bias voltage node 214, 314, 414, 514 can be located at a junction between adjacent resistors 213, 313, 413, 513 (e.g., between adjacent diode-connected transistors) in the chain. In the pull-up pre-drivers 200.1, 400.1, the specific bias voltages will each be at some level within a range from approximately one-half of VDD to VDD. In the pull-down pre-drivers 300.1, 500.1, the specific bias voltages will be at some level within a range from approximately one-half of VDD to ground. However, it should be understood that the relative locations in the chains of the bias voltage nodes or the sizes, numbers, etc. of the resistors in the chains can be varied between the switching circuits such that specific bias voltages 216(a)-216(c), 316(a)-316(c), 416(a)-416(c), 516(a)-516(c) supplied to the signal generation stages 220-240, 320-340, 420-440, 520-540 when the local switching bias circuits are in the ON state are different.

Optionally, each of the local switching bias circuits 210(a)-210(c), 310(a)-310(c), 410(a)-410(c), 510(a)-510(c) can include a multi-input/single output multiplexor 215, 315, 415, 515, which has multiple inputs that are electrically connected to multiple bias voltage nodes 214, 314, 414, 514 at different junctions between adjacent resistors in the chain and which has a single output electrically connected to a corresponding one of the signal generation stages. In this case, the multiplexors 215, 315, 415, 515 can be controlled by a stage-specific bias voltage select signal, thereby allowing a selected one of the multiple bias voltage nodes of a given local switching bias circuit to be electrically connected to a corresponding signal generation stage.

In any case, each local switching bias circuit 210(a)-210(c), 310(a)-310(c), 410(a)-410(c), 510(a)-510(c) can further include a pair of on/off switches (i.e., a first switch 211, 311, 411, 511 and a second switch 212, 312, 412, 512). The first switches 211, 311, 411, 511 of all of the local switching bias circuits can be controlled as discussed in greater detail below by an input signal 201, 301, 401, 501 to the pre-driver circuit 200.1, 300.1, 400.1, 500.1 so that the local switching bias circuits turn on concurrently and only when needed. The second switches 212, 312, 412, 512 of all of the local switching bias circuits can be controlled as discussed in greater detail below by the last pre-driver signal 246, 346, 446, 546 generated and output by the last stage 240, 340, 440, 540 so that the local switching bias circuits are all turned off concurrently when no longer needed.

With this configuration, during normal operation, all first switches 211, 311, 411, 511 of all local switching bias circuits and each of the signal generation stages 220-240, 320-340, 420-440, 520-540 can receive an input signal 201, 301, 401, 501 for processing.

In response to the input signal 201, 301, 401, 501 transitioning from a first voltage level to a second voltage level, the first switches 211, 311, 411, 511 can concurrently turn on the local switching bias circuits so that specific bias voltages 216(a)-216(c), 316(a)-316(c), 416(a)-416(c), 516(a)-516(c) are supplied to the signal generation stages 220-240, 320-340, 420-440, 520-540, respectively. For example, in the pull-up pre-drivers 200.1 and 400.1, the on/off switches 211-212, 411-412 can be n-type field effect transistors such that the transition of the input signal 201, 401 from a low voltage level to a high voltage level can turn on the local switching bias circuits 210(a)-210(c), 410(a)-410(c) so that the different specific bias voltages 216(a)-216(c), 416(a)-416(c) are supply to the signal generation stages 220-240, 420-440, respectively. In the pull-down pre-drivers 300.1 and 500.1, the on/off switches 311-312, 511-512 can be p-type field effect transistors such that the transition of the input signal 301, 501 from the high voltage level to the low voltage level can turn on the local switching bias circuits 310(a)-310(c), 510(a)-510(c) so that the different specific bias voltages 316(a)-316(c), 516(a)-516(c) are supply to the signal generation stages 320-340, 530-540, respectively.

Referring to FIGS. 10-13, the pre-drivers 200.2, 300.2, 400.2, 500.2 can include a single local switching bias circuit 210', 310', 410', 510', which is configured in essentially the same manner as the local switching bias circuit 210, 310, 410, 510 described in detail above and illustrated in the drawings with respect to the pre-drivers 200, 300, 400, 500 in order to generate multiple different bias voltages on multiple different bias voltage nodes 214, 314, 414, 514 (e.g., at different junctions between adjacent resistors, such as diode-connected transistors, in a resistor chain) when in an ON-state. The local switching bias circuit 210', 310', 410', 510' can further include a multi-input/multi-output multi-plexor 215', 315', 415', 515', which has multiple inputs that are electrically connected to the bias voltage nodes 214, 314, 414, 514 and which has multiple outputs electrically connected to the signal generation stages. This multi-input/multi-output multiplexor 215', 315', 415', 515' can be controlled by stage-specific bias voltage select signals in order to selectively electrically connect any one of the multiple bias voltage nodes 214, 314, 414, 514 to any one of the signal generation stages 220-240, 320-340, 420-440, 520-540.

The local switching bias circuit 210', 310', 410', 510' can further include on/off switches (i.e., a first switch 211, 311, 411, 511 and a second switch 212, 312, 412, 512). The first switch 211, 311, 411, 511 can be controlled as discussed in greater detail below by an input signal 201, 301, 401, 501 to the pre-driver circuit 200.2, 300.2, 400.2, 500.2 so that the local switching bias circuit 210', 310', 410', 510' turns on only when needed. The second switch 212, 312, 412, 512 can be controlled as discussed in greater detail below by the last pre-driver signal 246, 346, 446, 546 generated and output by the last stage 240, 340, 540, 640 so that the local switching bias circuit turns off when no longer needed.

With this configuration, during normal operation, the first switch 211, 311, 411, 511 and each of the signal generation stages 220-240, 320-340, 420-440, 520-540 can receive an input signal 201, 301, 401, 501 for processing.

In response to the input signal 201, 301, 401, 501 transitioning from a first voltage level to a second voltage level, the first switch 211, 311, 411, 511 turns on the local switching bias circuit, thereby generating the different bias voltages on the bias voltage nodes. For example, in the pull-up pre-drivers 200.2 and 400.2, the on/off switches 211-212, 411-412 can be n-type field effect transistors such that the transition of the input signal 201, 401 from a low voltage level to a high voltage level can turn on the local switching bias circuit. In the pull-down pre-drivers 300.2 and 500.2, the on/off switches 311-312, 511-512 can be p-type field effect transistors such that the transition of the input signal 301, 501 from the high voltage level to the low voltage level can turn on the local switching bias circuit. Additionally, the multi-input/multi-output multiplexor 215', 315', 415', 515' can receive stage-specific bias voltage select signals (i.e., bias voltage select signals for each of the signal generation stages) and, in response to these signals, the multiplexor can electrically connect the signal generation stages to selected bias voltage nodes, respectively. That is, each signal generation stage can be selectively connected to any one of the bias voltage nodes and, as a result, selected specific bias voltages 216(a)-216(c), 316(a)-316(c), 416(a)-416(c), 516(a)-516(c) are supplied to the signal generation stages 220-240, 320-340, 420-440, 520-540.

In each of the pre-driver circuit embodiments disclosed herein and illustrated in FIGS. 9-13, once the local switching bias circuit(s) is/are turned on, the signal generation stages 220-240, 320-340, 420-440, 520-540 can receive the specific bias voltages and, given the input signal, can generate and output pre-driver signals 226-246, 326-346, 426-446, 526-546, respectively.

Specifically, in the first stage 220, 320, 420, 520, the input signal 201, 301, 401, 501 is applied to the input of a primary inverter 225, 325, 425, 525 and a first specific bias voltage 216(a), 316(a), 416(a), 516(a) from a first specific bias node 214, 314, 414, 514 is applied (e.g., directly or via a multiplexor) to the gate of a power supply transistor 222, 322, 422, 522 (e.g., an n-type power supply transistor in the pull-up pre-drivers 200.1, 400.1 and a p-type field effect transistor in the pull-down pre-driver circuit 300.1, 500.1). Once the power supply transistor 222, 322, 422, 522 turns on in response to the first specific bias voltage 216(a), 316(a), 416(a), 516(a), the primary inverter 225, 325, 425, 525 will turn on and output the first pre-driver signal 226, 326, 426, 526.

In the second stage 230, 330, 430, 530, the input signal 201, 301, 401, 501 is applied to the input of a primary inverter 235, 335, 435, 535 and the first pre-driver signal 226, 326, 426, 526 from the first stage 220, 320, 420, 520 is applied to the input of a delay inverter 231, 331, 431, 531. In the pull-up pre-drivers 200.1, 400.1, the delay inverter 231, 431 is electrically connected (e.g., directly or via a multiplexor) to a second bias voltage node 214, 414 in order to receive a second specific bias voltage 216(b), 416(b) (which is at some specific bias voltage level within a range from approximately one-half of VDD to VDD) and is also electrically connected to ground. The output of the delay inverter 231, 431 is applied to the gate of an n-type power supply transistor 232, 432 and, when the output of the delay inverter 231, 431 switches to the level of the second specific bias voltage 216(b), 416(b), the n-type power supply transistor 232, 432 in the second stage 230, 430 will turn on. In the pull-down pre-drivers 300.1, 500.1, the delay inverter 331, 531 is electrically connected (e.g., directly or via a multiplexor) to a second bias voltage node 314, 514 in order to receive a second specific bias voltage 316(b), 516(b) (which is at some specific bias voltage level within a range from approximately one-half of VDD and ground) and is also electrically connected to VDD. The output of the delay inverter 331, 531 is applied to the gate of a p-type power supply transistor 332, 532 and, when the output of the delay inverter 331, 531 switches to the level of the second specific bias voltage 316(b), 516(b), the p-type power supply transistor 332, 532 in the second stage 330, 530 will turn on. In either case, once the power supply transistor 232, 332, 432, 532 of the second stage 230, 330, 430, 530 turns on in response to switching of the output of the delay inverter 231, 331, 431, 531, the primary inverter 235, 335, 435, 535 will turn on and output the second pre-driver signal 236, 336, 436, 536.

In the last stage 240, 340, 440, 540, the input signal 201, 301, 401, 501 is applied to the input of a primary inverter 245, 345, 445, 545 and the second pre-driver signal 236, 336, 436, 536 from the second stage is applied to the input of a delay inverter 241, 341, 441, 541. In the pull-up pre-drivers 200.1, 400.1, the delay inverter 241, 441 is electrically connected (e.g., directly or via a multiplexor) to a last bias voltage node 214, 414 in order to receive a last bias voltage 216(c), 416(c) (which is at some specific bias voltage level within a range from approximately one-half of VDD to VDD) and is also electrically connected to ground. The output of the delay inverter 241, 441 is applied to the gate of an n-type power supply transistor 242, 442 and, when the output of the delay inverter 241, 441 switches to the level of the last specific bias voltage 216(c), 416(c), the n-type power supply transistor 242, 442 in the last stage 240, 440 will turn on. In the pull-down pre-drivers 300.1, 500.1, the delay inverter 341, 541 is electrically connected (e.g., directly or via a multiplexor) to a last bias voltage node 314, 514 in order to receive a last specific bias voltage 316(c), 516(c) (which is at some specific bias voltage level within a range from approximately one-half of VDD and ground) and is also electrically connected to VDD. The output of the delay inverter 341, 541 is applied to the gate of a p-type power supply transistor 342, 542 and, when the output of the delay inverter 341, 541 switches to the level of the last specific bias voltage 316(c), 516(c), the p-type power supply transistor 342, 542 in the last stage 340, 540 will turn on. In either case, once the power supply transistor 242, 342, 442, 542 of the last stage 240, 340, 440, 540 turns on in response to switching of the output of the delay inverter 241, 341, 441, 541, the primary inverter 245, 345, 445, 545 will turn on and output the last pre-driver signal 246, 346, 446, 546.

In all of the pre-driver circuit embodiments disclosed herein, due to the specific bias voltages 216(a)-216(c), 316(a)-316(c), 416(a)-416(c), 516(a)-516(c) and due to the specific circuitry within each stage discussed above, the signal generation stages 220-240, 320-340, 420-440, 520-540 generate and output the pre-driver signals 226-246, 326-346, 426-446, 526-546 such that they are inverted with respect to the input signal 201, 301, 401, 501, such that transitioning of the pre-driver signals 226-246, 326-346, 426-446, 526-546 from the second voltage level to the first voltage level occurs in sequence (i.e., with a first pre-driver signal from the first stage transitioning first and a last signal from the last stage transitioning last), and such that this transitioning occurs at a slower rate than transitioning of the input signal (e.g., see the slew rates (SR1-SR3) of the pre-driver signals 226-246, 326-346, 426-446, 526-546, which are slower than the slew rate (SRi) of the input signal 201, 301, 401, 501).

Additionally, because all of the pre-driver circuit embodiments disclosed herein allow for different specific bias voltages to be applied to the different signal generation stages, the delays and transition times (i.e., slew rates) of the pre-driver signals can be different and, particularly, can be individually finely tuned, adjusted, etc. in order to reduce noise. For example, as illustrated in FIGS. 9-13, the slew rate of the first pre-driver signal 226, 326, 426, 526 (SR1) could be shorter than the slew rate of the second pre-driver signal 236, 336, 436, 536 (SR2) and the slew rate of the second pre-driver signal 236, 336, 436, 536 (SR2) could be shorter than the slew rate of the last pre-driver signal 246, 346, 446, 546 (SR3). In a pull-up pre-driver (e.g., see pull-up pre-drivers 200.1 of FIG. 6, 400.1 of FIG. 8, 200.2 of FIG. 10, and 400.2 of FIG. 12) this can be achieved, for example, if the first specific bias voltage 216(*a*), 416(*a*) supplied to the first stage 220, 420 is closer to VDD than the second specific bias voltage 216(*b*), 416(*b*) supplied to the second stage 230, 430 and if the second specific bias voltage 216(*b*), 416(*b*) supplied to the second stage 230, 430 is closer to VDD than the last specific bias voltage 216(*c*), 416(*c*) supplied to the last stage 240, 440. In a pull-down pre-driver (e.g., see pull-down pre-drivers 300.1 of FIG. 7, 500.1 of FIG. 9, 300.2 of FIG. 11, and 500.2 of FIG. 13) this can be achieved, for example, if the first specific bias voltage 316(*a*), 516(*a*) supplied to the first stage 320, 520 is closer to ground than the second specific bias voltage 316(*b*), 516(*b*) supplied to the second stage 330, 530 and if the second specific bias voltage 316(*b*), 516(*b*) supplied to the second stage 330, 530 is closer to ground than the last specific bias voltage 316(*c*), 516(*c*) supplied to the last stage 340, 540. This example is not intended to be limiting. It should be understood that, alternatively, the specific bias voltages supplied to the stages (e.g., as a function of the configurations of the local switching bias circuits in FIGS. 6-9 or as a function of the stage-specific bias voltage select signals sent to the multiplexor in FIGS. 10-13), the slew rates can be varied (e.g., the first pre-driver signal or the second pre-driver signal could have the longest slew rate; the second pre-driver signal or the last pre-driver signal could have the shortest slew rate; etc.).

It should be understood that the slew rates of the first pre-driver signal, second pre-driver signal, and last pre-driver signal are a function of the power supply transistors with the first stage, second stage and last stage, respectively. The delays of the second pre-driver signal and the last pre-driver signal are due to the delay inverters in the second stage and the last stage, respectively. The pre-drivers can be configured so that the delay and slew rate of a given pre-driver signal are related. For example, if/when the slew rate of the pre-driver signal is relatively slow, the delay of that pre-driver signal is relatively long and vice versa. Alternatively, the pre-drivers can be configured so that the delay and slew rate of a given pre-driver signal are unrelated (i.e., so that the slew rate can be adjusted without changing delay or vice versa).

It should also be understood that, while all of the pre-driver circuit embodiments disclosed herein are configured to enable different specific bias voltages to be applied to the different signal generation stages, they can also be configured to allow the same bias voltage to be applied to two or more of the signal generations stages. For example, in the pre-drivers 200.1, 300.1, 400.1 and 500.1, each of at least two of the switching bias circuits 210(*a*)-(*c*), 310(*a*)-(*c*), 410(*a*)-(*c*), 510(*a*)-(*c*) could alternatively be configured with voltage bias nodes that generate the same bias voltage when those switching bias circuits are in the ON state. The voltages bias nodes that generate the same bias voltage could be directly connected to corresponding signal generation stages so that those particular stages always receive the same bias voltage. Alternatively, if the switching bias circuit 210(*a*)-(*c*), 310(*a*)-(*c*), 410(*a*)-(*c*), 510(*a*)-(*c*) in the pre-drivers 200.1, 300.1, 400.1 and 500.1 are configured with optional multiplexors 215, 315, 415, 515, then the same or different bias voltages could be selectively applied to the signal generation stages depending upon the bias voltage select signals applied to those multiplexors. In the pre-drivers 200.2, 300.2, 400.2, 500.2 because the multi-input/multi-output multiplexor 215', 315', 415', 515' allows any one of the multiple bias voltage nodes in the switching bias circuit 210', 310', 410', 510' to be selectively connected to any one of the signal generation stages any of the following could occur: (a) stage-specific bias voltage select signals could be received by the multiplexor 215', 315', 415', 515' causing all of the signal generation stages to receive different bias voltages; (b) stage-specific bias voltage select signals could be received by the multiplexor 215', 315', 415', 515' causing only some of the signal generation stages to receive different bias voltages; or (c) stage-specific bias voltage select signals could be received by the multiplexor 215', 315', 415', 515' causing all of the signal generation stages to receive the same bias voltage.

In any case, the last pre-driver signal 246, 346, 446, 546 output from the last stage 240, 340, 440, 540 is output in a feedback loop. Specifically, in the pre-drivers 200.1, 300.1, 400.1, 500.1, this last pre-driver signal 246, 346, 446, 546 is output to all of the second switches 212, 312, 412, 512 in all of the local bias switching circuits 210(*a*)-210(*c*), 310(*a*)-310(*c*), 410(*a*)-410(*c*), 510(*a*)-510(*c*) and, when the last pre-driver signal 246, 346, 446, 546 transitions from the second voltage level back to the first voltage level, the second switches concurrently turn off the switching bias circuits. In the pre-drivers 200.2, 300.2, 400.2, 500.2, this last pre-driver signal 246, 346, 446, 546 is output to the second switch 212, 312, 412, 512 in the single local switching bias circuit 210', 310', 410', 510' and, when the last pre-driver signal 246, 346, 446, 546 transitions from the second voltage level back to the first voltage level, the second switch turns off the switching bias circuit. Specifically, as mentioned above, in the pull-up pre-drivers 200.1, 400.1, 200.2, 400.2, on/off switches 211-212, 411-412 can be n-type field effect transistors such that the transition of the last pre-driver signal 246, 446 from a high voltage level to a low voltage level can turn off the local switching bias circuit(s). In the pull-down pre-drivers 300.1, 500.1, 300.2 and 500.2, the on/off switches 311-312, 511-512 can be p-type field effect transistors such that the transition of the last pre-driver signal 346, 546 from the low voltage level to the high voltage level can turn off the local switching bias circuit(s). By turning off the switching bias circuit(s), once the pre-driver signals have all been generated, leakage current is reduced.

Optionally, all of the pre-drivers disclosed herein incorporate a bypass circuit that is configured to allow for operation in a bypass mode. During the bypass mode, transitioning of the delay signals can be forced to occur concurrently. For example, the pull-up pre-driver 400.1 of FIG. 8 and the pull-up pre-driver 400.2 of FIG. 12 can each be configured with a bypass circuit 460 that enables operation in a bypass mode (also referred to herein as a fast mode). During the bypass mode, the bypass circuit ensures that transitioning of the pull-up pre-driver signals 426, 436, 446 from the high voltage level to the low voltage level occurs concurrently. This bypass circuit can be essentially the same as the bypass circuit of the pull-up pre-driver 400 described in detail above and illustrated in FIG. 4. Similarly, the pull-down pre-drivers 500.1 of FIG. 9 and 500.2 of FIG. 12 can each be configured with a bypass circuit 560 that enables operation in a bypass mode (also referred to herein as a fast mode). During the bypass mode, the bypass circuit ensures that transitioning of the pull-down pre-driver signals 526, 536, 546 from the low voltage level to the high voltage level occurs concurrently. This bypass circuit can be essentially the same as the bypass circuit of the pull-down pre-driver 500 described in detail above and illustrated in FIG. 5.

It should be understood that the terminology used herein is for the purpose of describing the disclosed structures and methods and is not intended to be limiting. For example, as used herein, the singular forms "a", "an" and "the" are intended to include the plural forms as well, unless the context clearly indicates otherwise. Additionally, as used herein, the terms "comprises" "comprising", "includes" and/or "including" specify the presence of stated features, integers, steps, operations, elements, and/or components, but do not preclude the presence or addition of one or more other features, integers, steps, operations, elements, components, and/or groups thereof. Furthermore, as used herein, terms such as "right", "left", "vertical", "horizontal", "top", "bottom", "upper", "lower", "under", "below", "underlying", "over", "overlying", "parallel", "perpendicular", etc., are intended to describe relative locations as they are oriented and illustrated in the drawings (unless otherwise indicated) and terms such as "touching", "in direct contact", "abutting", "directly adjacent to", "immediately adjacent to", etc., are intended to indicate that at least one element physically contacts another element (without other elements separating the described elements). The term "laterally" is used herein to describe the relative locations of elements and, more particularly, to indicate that an element is positioned to the side of another element as opposed to above or below the other element, as those elements are oriented and illustrated in the drawings. For example, an element that is positioned laterally adjacent to another element will be beside the other element, an element that is positioned laterally immediately adjacent to another element will be directly beside the other element, and an element that laterally surrounds another element will be adjacent to and border the outer sidewalls of the other element. The corresponding structures, materials, acts, and equivalents of all means or step plus function elements in the claims below are intended to include any structure, material, or act for performing the function in combination with other claimed elements as specifically claimed.

The descriptions of the various embodiments of the present invention have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

What is claimed is:

1. A pre-driver circuit comprising:
   multiple stages; and
   multiple switching bias circuits, wherein each switching bias circuit comprises: a bias voltage node electrically connected to at least one of the stages; a first switch; and a second switch,
   wherein all first switches of all of the switching bias circuits receive an input signal and, in response to the input signal transitioning from a first voltage level to a second voltage level, the first switches turn on the switching bias circuits so that the switching bias circuits generate and supply bias voltages to the stages,
   wherein all of the stages receive the input signal and, in response the input signal transitioning from the first voltage level to the second voltage level and given the bias voltages, the stages generate and output pre-driver signals, respectively, such that transitioning of the pre-driver signals from the second voltage level to the first voltage level occurs in sequence, and
   wherein all second switches of all of the switching bias circuits receive a last pre-driver signal from a last stage and, in response to the last pre-driver signal transitioning from the second voltage level to the first voltage level, the second switches turn off the switching bias circuits.

2. The pre-driver circuit of claim 1, wherein tuning of delays and slew rates of the pre-driver signals is achieved by supplying different bias voltages to the stages through the switching bias circuits.

3. The pre-driver circuit of claim 1, wherein each switching bias circuit comprises a group of series-connected resistors connected at a first end by the first switch to a first voltage rail and connected at a second end by the second switch to a second voltage rail and wherein the bias voltage node is at a junction between adjacent resistors in the group.

4. The pre-driver circuit of claim 1, wherein each switching bias circuit comprises a group of series-connected transistors, wherein two transistors in the group comprise the first switch and the second switch, respectively, wherein all other transistors in the group comprise diode-connected transistors, and wherein the bias voltage node is at a junction between adjacent transistors in the group.

5. The pre-driver circuit of claim 1,
   wherein the stages comprise: a first stage; a second stage and the last stage,
   wherein each stage comprises: a power supply transistor; and a primary inverter that is connected to a drain region of the power supply transistor and that inverts the input signal when the power supply transistor turns on,
   wherein, in the first stage, a gate of the power supply transistor is connected to a first bias voltage node of a first switching bias circuit,
   wherein the second stage and the last stage further comprise a delay inverter connected between a voltage rail and a corresponding bias voltage node of a corresponding switching bias circuit, and
   wherein an input to the delay inverter is an output from the primary inverter of a previous stage and an output of the delay inverter is applied to a gate of the power supply transistor.

6. The pre-driver circuit of claim 5, wherein, due to the bias voltages and outputs from each delay inverter, power supply transistors in the stages turn on in sequence such that the transitioning of the pre-driver signals from the second voltage level to the first voltage level occurs in sequence to reduce noise.

7. The pre-driver circuit of claim 6, wherein, due to the bias voltages and outputs from each delay inverter, the transitioning of the pre-driver signals from the second voltage level to the first voltage level occurs at a slower rate than the transitioning of the input signal from the first voltage level to the second voltage level to reduce noise.

8. A pre-driver circuit comprising:
   multiple stages;
   a switching bias circuit comprising: bias voltage nodes; a first switch; and a second switch; and
   a multiplexor comprising multiple inputs electrically connected to the bias voltage nodes and multiple outputs electrically connected to the stages,
   wherein the first switch receives an input signal and, in response to the input signal transitioning from a first voltage level to a second voltage level, the first switch turns on the switching bias circuit enabling the switching bias circuit to generate different bias voltages on the bias voltage nodes, wherein the multiplexor receives bias voltage select signals and, in response to the bias voltage select signals, supplies selected bias voltages to the stages, wherein each of the stages further receive the input signal and, in response to the input signal transitioning from the first voltage level to the second voltage level and given the selected bias voltages, the stages generate and output pre-driver signals, respectively, such that transitioning of the pre-driver signals from the second voltage level to the first voltage level occurs in sequence, and wherein the second switch receives a last pre-driver signal from a last stage and, in response to the last pre-driver signal transitioning from the second voltage level to the first voltage level, the second switch turns off the switching bias circuit.

9. The pre-driver circuit of claim 8, wherein tuning of delays and slew rates of the pre-driver signals is achieved through stage-specific bias voltage selection using the multiplexor.

10. The pre-driver circuit of claim 8,
wherein the pre-driver circuit is a pull-up pre-driver circuit comprising: a first stage; a second stage; and the last stage, wherein the switching bias circuit comprises a group of n-type field effect transistors connected in series between a positive voltage rail and ground, wherein the bias voltage nodes are at junctions between adjacent n-type field effect transistors in the group, wherein one of the n-type field effect transistors in the group comprises the first switch, another of the n-type field effect transistors in the group comprises the second switch, and all others of the n-type field effect transistors in the group comprise diode-connected transistors, wherein, in response to the input signal transitioning from a low voltage level to a high voltage level, the first switch turns on the switching bias circuit, the first stage generates and outputs a first pull-up pre-driver signal, the second stage generates and outputs a second pull-up pre-driver signal and the last stage generates and outputs a last pull-up pre-driver signal such that transitioning of the first pull-up pre-driver signal, the second pull-up pre-driver signal and the last pull-up pre-driver signal from the high voltage level to the low voltage level occurs in sequence, and wherein, in response to the last pull-up pre-driver signal transitioning from the high voltage level to the low voltage level, the second switch turns off the switching bias circuit.

11. The pre-driver circuit of claim 10,
wherein the different bias voltages are at levels within a range from a positive supply voltage level and approximately one-half the positive supply voltage level, wherein each stage comprises: an n-type power supply transistor; and a primary inverter that is connected to a drain region of the n-type power supply transistor and that inverts the input signal when the n-type power supply transistor turns on, wherein, in the first stage, a gate of the n-type power supply transistor is connected to a selected one of the bias voltage nodes, wherein the second stage and the last stage each further comprise a delay inverter that is connected between a selected one of the bias voltage nodes and ground, wherein an input to the delay inverter is an output from the primary inverter of a previous stage and an output from the delay inverter is applied to the gate of the n-type power supply transistor, and wherein the first pull-up pre-driver signal from the first stage is inverted with respect to the input signal and the second pull-up pre-driver signal from the second stage and the last pull-up pre-driver signal from the last stage are inverted and delayed with respect to the input signal.

12. The pre-driver of claim 11, wherein, due to the selected bias voltages and outputs from each delay inverter, n-type power supply transistors in the stages, respectively, turn on in sequence such that the transitioning of the pre-driver signals from the high voltage level to the low voltage level occurs in sequence to reduce noise.

13. The pull-up pre-driver of claim 12, wherein, due to the selected bias voltages and the outputs from each delay inverter, the transitioning of the pre-driver signals from the high voltage level to the low voltage level occurs at a slower rate than the transitioning of the input signal from the low voltage level to the high voltage level to reduce noise.

14. The pre-driver circuit of claim 10, further comprising a bypass circuit, wherein, during a bypass mode, the bypass circuit ensures that transitioning of the pre-driver signals from the high voltage level to the low voltage level occurs concurrently.

15. A pre-driver circuit comprising:
multiple stages comprising: a first stage; a second stage; and a last stage;

a switching bias circuit comprising: bias voltage nodes; a first switch; and a second switch; and a multiplexor comprising multiple inputs electrically connected to the bias voltage nodes and multiple outputs electrically connected to the stages, wherein the first switch receives an input signal and, in response to the input signal transitioning from a first voltage level to a second voltage level, the first switch turns on the switching bias circuit enabling the switching bias circuit to generate different bias voltages on the bias voltage nodes, wherein the multiplexor receives bias voltage select signals and, in response to the bias voltage select signals, supplies selected bias voltages to the stages, wherein each of the stages further receive the input signal and, in response to the input signal transitioning from the first voltage level to the second voltage level and given the selected bias voltages, the first stage generates and outputs a first pre-driver signal, the second stage generates and outputs a second pre-driver signal and the last stage generates and outputs a last pre-driver signals such that transitioning of the first pre-driver signal, the second pre-driver signal and the last pre-driver signal from the second voltage level to the first voltage level occurs in sequence, and wherein the second switch receives the last pre-driver signal and, in response to the last pre-driver signal transitioning from the second voltage level to the first voltage level, the second switch turns off the switching bias circuit.

16. The pre-driver circuit of claim 15, wherein tuning of delays and slew rates of the first pre-driver signal, the second pre-driver signal and the last pre-driver signal is achieved through stage-specific bias voltage selection.

17. The pre-driver circuit of claim 15,
wherein the pre-driver circuit is a pull-down pre-driver circuit,
wherein the switching bias circuit comprises: a group of p-type field effect transistors connected in series between a positive voltage rail and ground,
wherein the bias voltage nodes are at junctions between adjacent p-type field effect transistors in the group,
wherein one of the p-type field effect transistors in the group comprises the first switch, another of the p-type field effect transistors in the group comprises a second switch, and all others of the p-type field effect transistors in the group comprise diode-connected transistors,
wherein, in response to the input signal transitioning from a high voltage level to a low voltage level, the first switch turns on the switching bias circuit and the first stage generates and outputs a first pull-down pre-driver signal, the second stage generates and outputs a second pull-down pre-driver signal and the last stage generates and outputs a last pull-down pre-driver signal such that transitioning of the first pull-down pre-driver signal, the second pull-down pre-driver signal and the last pull-down pre-driver signal from the low voltage level to the high voltage level occurs in sequence, and
wherein the second switch receives the last pull-down pre-driver signal and, in response to the last pull-down pre-driver signal transitioning from the low voltage level to the high voltage level, the second switch turns off the switching bias circuit.

18. The pre-driver circuit of claim 17,
wherein the different bias voltages are at levels within a range from approximately one-half a positive supply voltage level and ground,
wherein each stage comprises: an p-type power supply transistor; and a primary inverter that is connected to a drain region of the p-type power supply transistor and that inverts the input signal when the p-type power supply transistor turns on,
wherein, in the first stage, a gate of the p-type power supply transistor is connected to a selected one of the bias voltage nodes,
wherein the second stage and the last stage each further comprise a delay inverter that is connected between the positive voltage rail and a selected one of the bias voltage nodes,
wherein an input to the delay inverter is an output from the primary inverter of a previous stage and an output from the delay inverter is applied to the gate of the p-type power supply transistor, and
wherein the first pull-down pre-driver signal from the first stage is inverted with respect to the input signal and the second pull-down pre-driver signal from the second stage and the last pull-down pre-driver signal from the last stage are inverted and delayed with respect to the input signal.

19. The pre-driver circuit of claim 18, wherein, due to the selected bias voltages and outputs from each delay inverter, p-type power supply transistors in the stages, respectively, turn on in sequence such that the transitioning of the first pull-down pre-driver signal, the second pull-down pre-driver signal and the last pull-down pre-driver signal from the low voltage level to the high voltage level occurs in sequence to reduce noise.

20. The pre-driver circuit of claim 19, wherein, due to the selected bias voltages and the outputs from each delay inverter, the transitioning of the first pull-down pre-driver signal, the second pull-down pre-driver signal and the last pull-down pre-driver signal from the low voltage level to the high voltage level occurs at a slower rate than the transitioning of the input signal from the high voltage level to the low voltage level to reduce noise.

* * * * *